United States Patent
Choi et al.

(10) Patent No.: US 8,067,774 B2
(45) Date of Patent: Nov. 29, 2011

(54) THIN FILM TRANSISTOR PANEL AND METHOD OF MANUFACTURING THE SAME

(75) Inventors: Seung-Ha Choi, Siheung-si (KR); Ki-Yeup Lee, Seoul (KR); Sang-Gab Kim, Seoul (KR); Shin-il Choi, Seoul (KR); Dong-Ju Yang, Seoul (KR); Hong-Kee Chin, Suwon-si (KR); Yu-Gwang Jeong, Yongin-si (KR); Ji-Young Park, Suwon-si (KR); Dong-Hoon Lee, Seoul (KR); Byeong-Beom Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 215 days.

(21) Appl. No.: 12/434,942

(22) Filed: May 4, 2009

(65) Prior Publication Data
US 2010/0044717 A1   Feb. 25, 2010

(30) Foreign Application Priority Data
Aug. 20, 2008   (KR) ........................ 10-2008-0081356

(51) Int. Cl.
*H01L 27/14* (2006.01)
(52) U.S. Cl. .................. 257/72; 257/E29.273
(58) Field of Classification Search .................... 257/72, 257/E29.273
See application file for complete search history.

(56) References Cited

U.S. PATENT DOCUMENTS

| 6,376,861 | B1 | 4/2002 | Yaegashi et al. | |
|---|---|---|---|---|
| 6,407,780 | B1 | 6/2002 | Sung | |
| 7,303,987 | B2 * | 12/2007 | Lim et al. | 438/625 |
| 2004/0233343 | A1 * | 11/2004 | Baek | 349/38 |
| 2006/0152645 | A1 * | 7/2006 | Song et al. | 349/43 |
| 2007/0109469 | A1 * | 5/2007 | Jeon et al. | 349/110 |
| 2007/0177067 | A1 * | 8/2007 | Kim et al. | 349/43 |

FOREIGN PATENT DOCUMENTS

| JP | 2008-010342 | 1/2001 |
|---|---|---|
| JP | 2004-363471 | 12/2004 |
| JP | 2006-023388 | 1/2006 |
| JP | 2007-317934 | 12/2007 |
| JP | 2008-003319 | 1/2008 |
| KR | 10-2002-0089981 | 11/2002 |
| KR | 10-2007-0121594 | 12/2007 |
| KR | 10-2008-0012490 | 2/2008 |
| KR | 10-2008-0037347 | 4/2008 |

* cited by examiner

*Primary Examiner* — Trung Q Dang
(74) *Attorney, Agent, or Firm* — Cantor Colburn LLP

(57) ABSTRACT

After forming a signal line including aluminum, an upper layer of an oxide layer including aluminum that covers the signal line is formed in the same chamber and by using the same sputtering target as the signal line, or a buffer layer of an oxide layer including aluminum is formed in a contact hole exposing the signal line during the formation of the contact hole. Accordingly, the contact characteristic between an upper layer including indium tin oxide ("ITO") or indium zinc oxide ("IZO") and the signal line may be improved to enhance the adhesion therebetween while not increasing the production cost of the thin film transistor ("TFT") array panel.

13 Claims, 54 Drawing Sheets

FIG.28

|   | 1 | 2 | 3 | 4 | 5 |
|---|---|---|---|---|---|
| A | | | | | |
| Rcdi | 2.82E+04 | 1.60E+04 | 1.80E+04 | 9.85E+03 | 1.80E+04 |
| Rcgi | 3.89E+04 | 2.39E+04 | 3.59E+04 | 1.84E+04 | 2.93E+04 |
| B | | | | | |
| Rcdi | 5.26E+03 | 5.74E+03 | 6.69E+03 | 5.20E+03 | 5.72E+03 |
| Rcgi | 1.15E+04 | 1.25E+04 | 1.24E+04 | 1.24E+04 | 1.22E+04 |

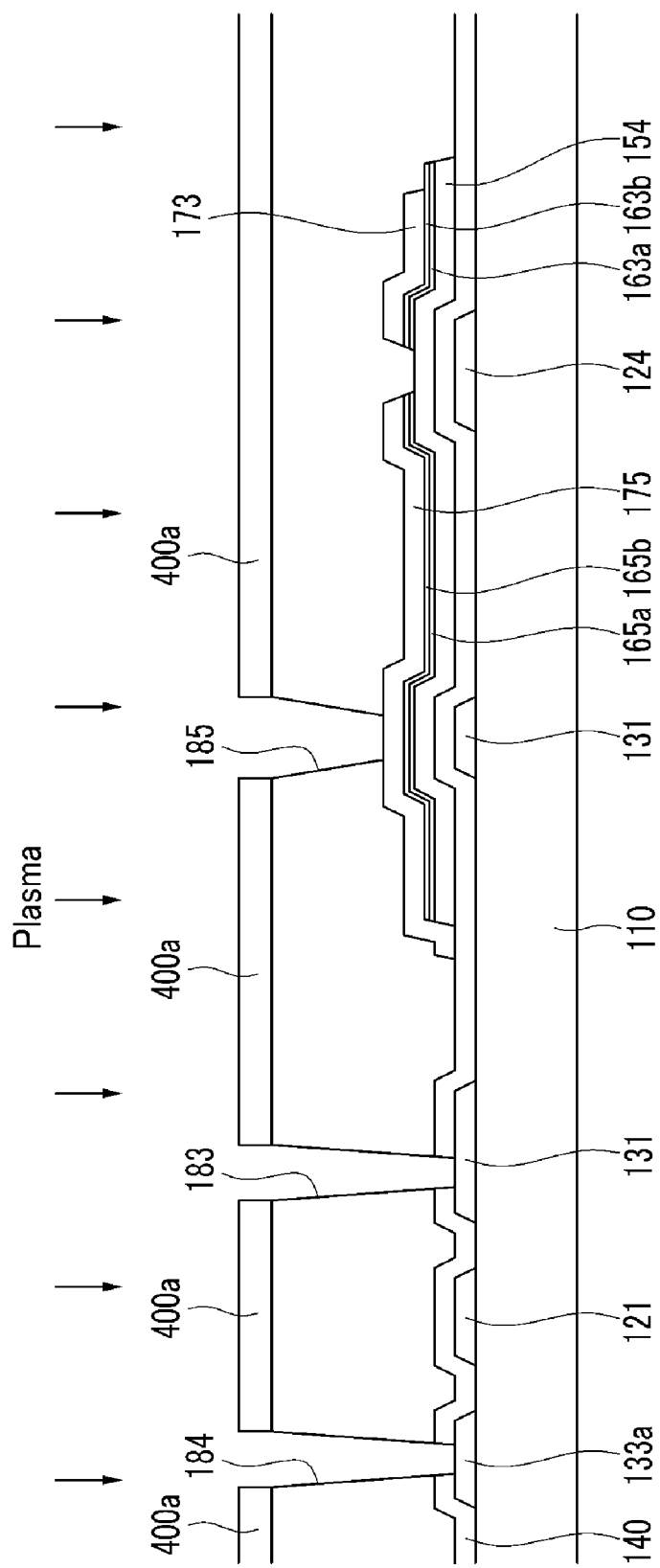

THIN FILM TRANSISTOR PANEL AND METHOD OF MANUFACTURING THE SAME

This application claims priority to Korean Patent Application No. 10-2008-0081356, filed on Aug. 20, 2008, and all the benefits accruing therefrom under 35 U.S.C. §119, the contents of which in its entirety are herein incorporated by reference.

BACKGROUND OF THE INVENTION (a) Field of the Invention

The present invention relates to a thin film transistor ("TFT") array panel and a manufacturing method thereof. More particularly, the present invention relates to a TFT array panel having improved contact characteristics between a signal line and an upper layer, and a manufacturing method of the TFT array panel.

(b) Description of the Related Art

Flat panel displays such as a liquid crystal display ("LCD") and an organic light emitting diode ("OLED") display include several pairs of field generating electrodes and electro-optical active layers interposed therebetween. The LCD includes a liquid crystal layer as an electro-optical active layer, and the OLED includes an organic emission layer as the electro-optical active layer.

One electrode of a pair of field generating electrodes, i.e., a pixel electrode, is commonly connected to a switching element for transmitting electrical signals to the pixel electrode, and the electro-optical active layer converts the electrical signals to optical signals to display an image.

A thin film transistor ("TFT") having three terminals is used for the switching element in the flat panel display, and a plurality of signal lines such as gate lines and data lines are also provided on the flat panel display. The gate lines transmit signals for controlling the TFTs and the data lines transmit signals applied to the pixel electrodes.

Wiring made of a material having low resistivity, such as aluminum (Al), is commonly used for the signal lines of the flat panel display.

However, a signal line made of aluminum has a poor contact property with other materials such as indium-tin-oxide ("ITO") and indium zinc oxide ("IZO"), and thus a pixel electrode of ITO or IZO in direct contact with the aluminum signal line may receive imperfect signals from the aluminum signal line.

Accordingly, for improving the contact property between the signal line made of aluminum and the upper layer made of ITO or IZO, it is known that the signal lines have a multi-layered structure including a lower layer of aluminum and an upper layer covering the lower layer of aluminum and made of a material such as a molybdenum (Mo)-containing metal, chromium (Cr), tantalum (Ta), or titanium (Ti), which has good physical, chemical, and electrical contact characteristics with other materials such as ITO or IZO.

BRIEF SUMMARY OF THE INVENTION

It has been determined herein, according to the present invention, that when signal lines of a conventional flat panel display are made to have a multi-layered structure including the upper layer covering the lower layer of aluminum and made of another metal, the manufacturing process may be complicated such that a metal target must be changed or a substrate must be transferred to another deposition apparatus to manufacturing the signal lines. Accordingly, the yield may be decreased and production cost may be increased for a conventional flat panel display.

A thin film transistor ("TFT") array panel according to an exemplary embodiment of the present invention includes a substrate, a gate line disposed on the substrate, including a first metal layer and a first metal oxide layer, a gate insulating layer disposed on the gate line, a semiconductor layer disposed on the gate insulating layer, a data line disposed on the semiconductor layer, including a source electrode, and including a second metal layer and a second metal oxide layer, a drain electrode disposed on the semiconductor layer, spaced apart from the source electrode, and including the second metal layer and the second metal oxide layer, and a pixel electrode electrically connected to the drain electrode.

The first and second metal layers and the first and second metal oxide layers may include aluminum (Al) or an aluminum alloy.

The aluminum alloy may include aluminum (Al) and nickel (Ni), and may further include at least one of copper (Cu), boron (B), cerium (Ce), and lanthanum (La).

The first and second metal layers and the first and second metal oxide layers may be deposited by sputtering using the same metal target in the same sputtering chamber.

The metal target may include aluminum (Al) or an aluminum alloy.

The first metal oxide layer may have a thickness of about 5% to about 50% of that of the first metal layer, and the second metal oxide layer may have a thickness of about 5% to about 50% of that of the second metal layer, and more particularly, the first metal oxide layer may have a thickness of about 10% of that of the first metal layer, and the second metal oxide layer may have a thickness of about 10% of that of the second metal layer.

The data line and the drain electrode may further include a third metal layer disposed under the second metal layer, and the third metal layer may include at least one of molybdenum (Mo), chromium (Cr), tantalum (Ta), and titanium (Ti).

The semiconductor layer may have substantially the same planar shape as the data line and the drain electrode except at a channel portion.

A TFT array panel according to another exemplary embodiment of the present invention includes a substrate, a gate line disposed on the substrate, including a gate electrode, and having a single-layered structure and a storage line disposed on the substrate and having a single-layered structure, a gate insulating layer disposed on the gate line, a semiconductor layer disposed on the gate insulating layer, a data line disposed on the semiconductor layer, including a source electrode having a single-layered structure, a drain electrode disposed on the semiconductor layer, spaced apart from the source electrode, and having a single-layered structure, a passivation layer disposed on the data line and the drain electrode, and having a first contact hole exposing the drain electrode, a first buffer member in the upper surface of the drain electrode exposed through the first contact hole, and a pixel electrode electrically connected to the drain electrode through the first buffer member.

The gate line and the data line may include the same material.

The gate line and the data line may include aluminum (Al) or an aluminum alloy.

The first buffer layer may include an aluminum oxide layer.

The TFT array panel may further include a blocking layer disposed between the semiconductor layer and the data line and drain electrode, and including nitrogen or a nitrogen compound.

The passivation layer and the gate insulating layer may have a second contact hole exposing a portion of the storage line and the passivation layer may have a third contact hole exposing a portion of the data line, and the TFT array panel may further include a second buffer member disposed in the upper surface of the storage line exposed through the second contact hole and a third buffer member disposed in the upper surface of the data line exposed through the third contact hole.

The first buffer member, the second buffer member, and the third buffer member may include an aluminum oxide layer.

A method of manufacturing a TFT array panel according to an exemplary embodiment of the present invention includes sequentially depositing a first metal layer and a first metal oxide layer on a substrate in the same sputtering chamber, forming a gate line by photolithography and etching the first metal layer and the first metal oxide layer, disposing a gate insulating layer on the gate line, disposing a semiconductor layer on the gate insulating layer, sequentially depositing a second metal layer and a second metal oxide layer on a substrate in the same sputtering chamber, forming a data line including a source electrode and a drain electrode by photolithography and etching the second metal layer and the second metal oxide layer, and disposing a pixel electrode electrically connected to the drain electrode.

The first and second metal layers and the first and second metal oxide layers may include aluminum (Al) or an aluminum alloy.

The aluminum alloy may include aluminum (Al) and nickel (Ni), and may further include at least one of copper (Cu), boron (B), cerium (Ce), and lanthanum (La).

The first metal oxide layer may have a thickness of about 5% to about 50% of that of the first metal layer, and the second metal oxide layer may have a thickness of about 5% to about 50% of that of the second metal layer, and more particularly, the first metal oxide layer may have a thickness of about 10% of that of the first metal layer, and the second metal oxide layer may have a thickness of about 10% of that of the second metal layer.

Forming the semiconductor layer and forming of the data line and the drain electrode may be simultaneously performed by using one mask.

A method of manufacturing a TFT array panel according to another exemplary embodiment of the present invention includes disposing a gate line and a storage line having a single-layered structure on a substrate, disposing a gate insulating layer on the gate line, disposing a semiconductor layer on the gate insulating layer, disposing a data line including a source electrode and a drain electrode on the semiconductor layer, the data line and the drain electrode having a single-layered structure, disposing a passivation layer having a first contact hole exposing the drain electrode on the data line and the drain electrode, disposing a first buffer layer in the upper surface of the exposed drain electrode through the first contact hole, and disposing a pixel electrode electrically connected to the drain electrode through the first buffer layer.

The gate line and the data line may include the same material.

The gate line and the data line may include aluminum (Al) or an aluminum alloy.

The first buffer layer may include an aluminum oxide layer.

The first buffer layer may be formed by subjecting the surface of the drain electrode including aluminum (Al) or and aluminum alloy to oxygen plasma treatment.

The method may further include forming a blocking layer including nitrogen or a nitrogen compound between the semiconductor layer, and the data line and drain electrode.

The method may further include forming a second contact hole exposing a portion of the storage line in the passivation layer and the gate insulating layer, forming a third contact hole exposing a portion of the data line in the passivation layer, and forming a second buffer member in the upper surface of the exposed storage line through the second contact hole and a third buffer member in the upper surface of the exposed data line through the third contact hole.

The first buffer member, the second buffer member, and the third buffer member may be formed by subjecting the surface of the drain electrode, the gate line, and the data line including aluminum (Al) or an aluminum alloy to oxygen plasma treatment.

Forming the semiconductor layer and forming of the data line and the drain electrode may be simultaneously performed by using one mask.

BRIEF DESCRIPTION OF THE DRAWINGS

The above and other features and advantages of the present invention will become more apparent by describing exemplary embodiments thereof with reference to the accompanying drawings, in which:

FIG. 28 is a table showing contact resistance between an aluminum signal line and an upper layer in an experimental example of the present invention;

FIG. 47A to FIG. 47E are sectional views sequentially showing an exemplary manufacturing method of the exemplary TFT array panel shown in FIG. 44 to FIG. 46;

DETAILED DESCRIPTION OF THE INVENTION

Figure 1:
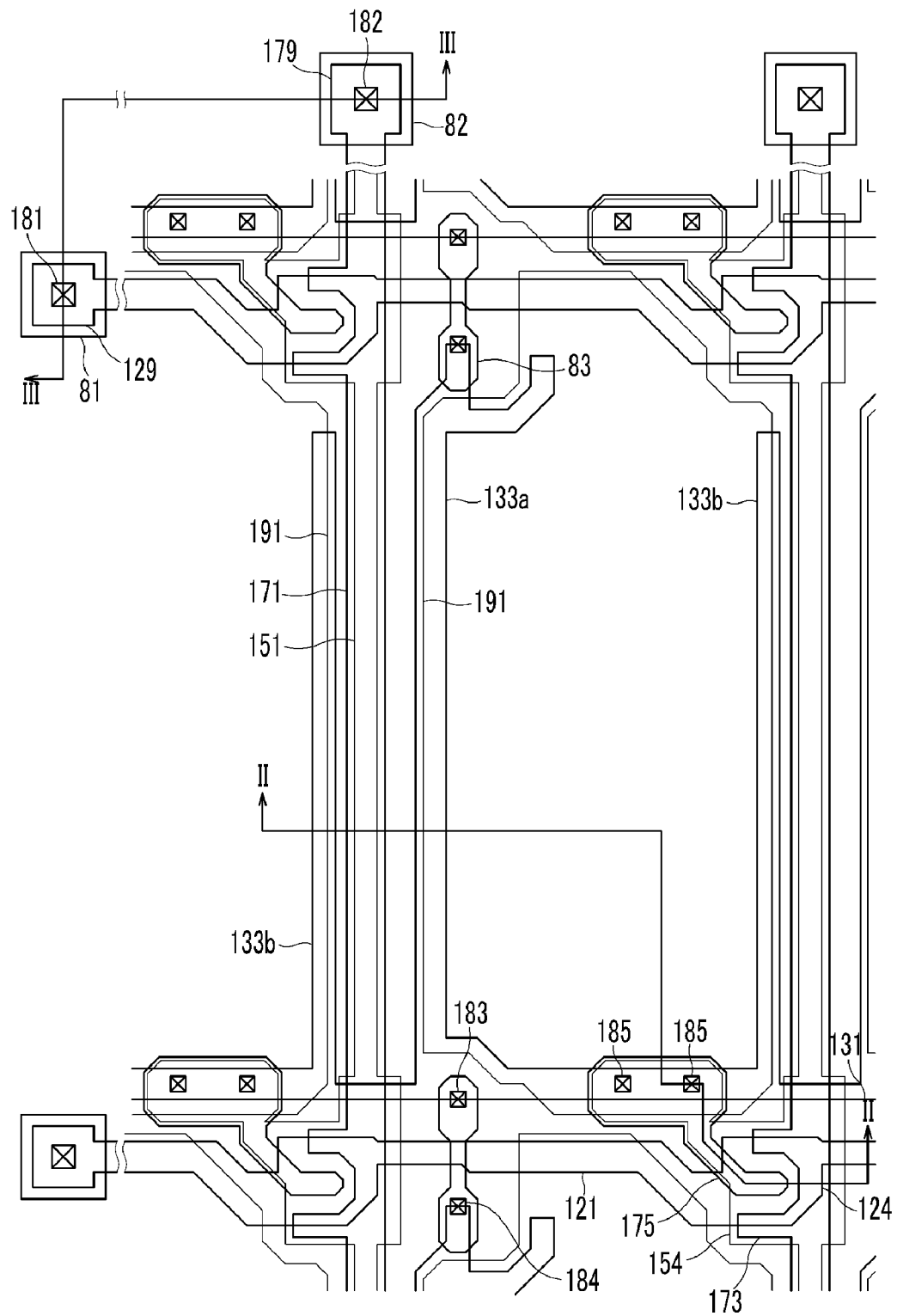
FIG. 1 is a layout view of an exemplary TFT array panel according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

First, a thin film transistor ("TFT") array panel according to an exemplary embodiment of the present invention will be described in detail with reference to FIGS. 1, 2, and 3.

Figure 2:
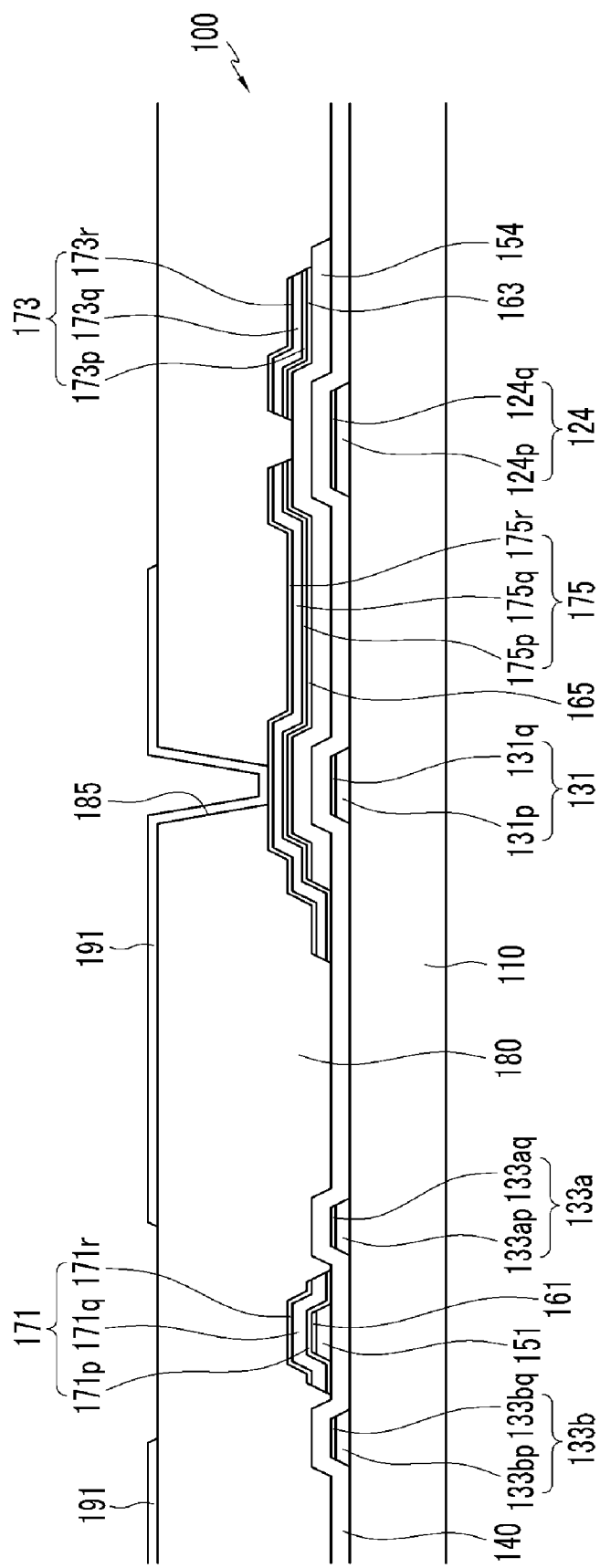
FIG. 2 and FIG. 3 are sectional views of the exemplary TFT array panel shown in FIG. 1 taken along lines II-II and III-III, respectively.
Figure 3:
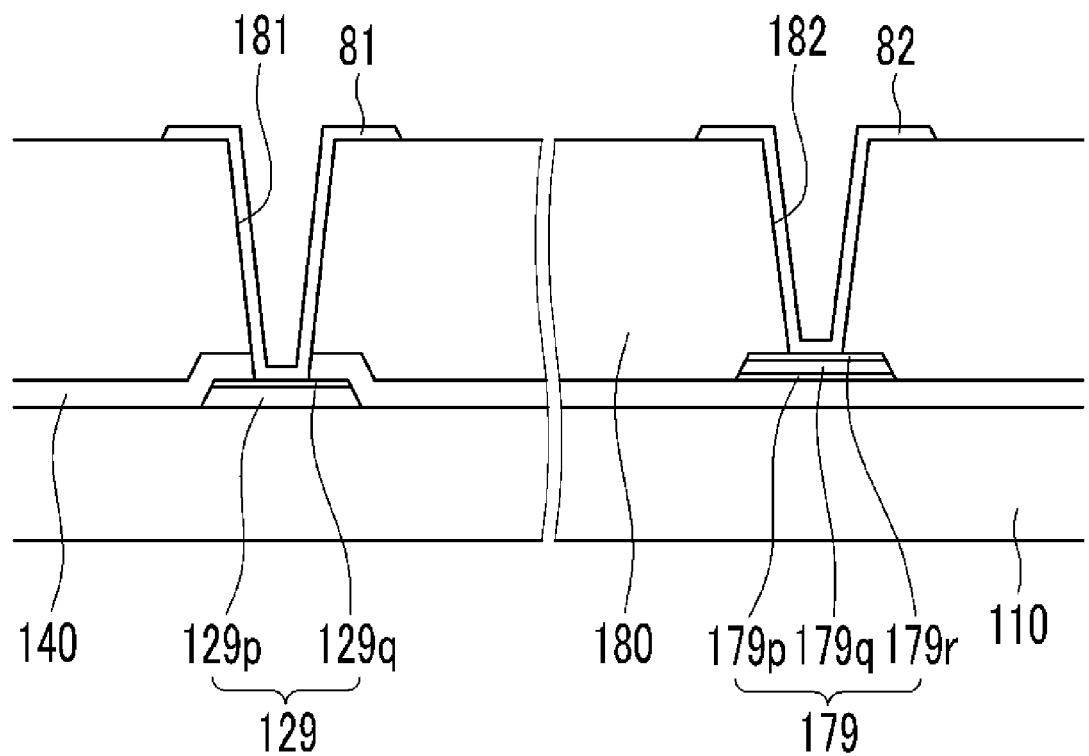

FIG. 1 is a layout view of an exemplary TFT array panel according to an exemplary embodiment of the present invention, and FIG. 2 and FIG. 3 are sectional views of the exemplary TFT array panel shown in FIG. 1 taken along lines II-II and III-III, respectively.

A plurality of gate lines 121 and a plurality of storage electrode lines 131 are formed, hereinafter disposed, on an insulating substrate 110 made of a material such as, but not limited to, transparent glass or plastic.

The gate lines 121 transmit gate signals and extend substantially in a transverse direction, a first direction. Each of the gate lines 121 includes a plurality of gate electrodes 124 projecting downward towards an adjacent gate line 121 and an end portion 129 having a large area for contact with another layer or an external driving circuit. A gate driving circuit (not shown) for generating the gate signals may be mounted on a flexible printed circuit ("FPC") film (not shown), which may be attached to the substrate 110, directly mounted on the substrate 110, or integrated with the substrate 110. The gate lines 121 may extend to be connected to a driving circuit that may be integrated with the substrate 110.

The storage electrode lines 131 are supplied with a predetermined voltage, and each of the storage electrode lines 131 includes a stem extending substantially parallel to the gate lines 121 and a plurality of pairs of first and second storage electrodes 133a and 133b branching from the stem. Each of the storage electrode lines 131 is disposed between two adjacent gate lines 121, and the stem may be closer to one of the two adjacent gate lines 121 than the other. Each of the storage electrodes 133a and 133b has a fixed end portion connected to the stem and a free end portion disposed opposite thereto. The fixed end portion of the first storage electrode 133a has a large area, and the free end portion thereof is bifurcated into a linear branch and a curved branch. While a particular arrangement of the storage electrode lines 131 has been described, the storage electrode lines 131 may have various shapes and arrangements.

The gate lines 121 and storage electrode lines 131 respectively include two conductive films, a lower film 121p and 131p and an upper film 121q and 131q disposed thereon, which have different physical characteristics. The lower film 121p and 131p may be made of a low resistivity metal including an aluminum (Al)-containing metal for reducing signal delay or voltage drop, and the upper film 121q and 131q may be made of an oxide layer including an Al-containing metal. The lower film 121p and 131p and the upper film 121q and 131q include the same aluminum alloy material because the lower film 121p and 131p and the upper film 121q and 131q are deposited by sputtering using the same aluminum alloy target. Here, the aluminum alloy includes aluminum and nickel (Ni). In addition, the aluminum alloy may include at least one of copper (Cu), boron (B), cerium (Ce), and lanthanum (La).

The upper film 121q and 131q may contribute to enhancing the contact characteristic of the lower film 121p and 131p including aluminum.

The thickness of the upper film 121q and 131q may be about 5% to about 50% of that of the lower film 121p and 131p, and more particularly may be about 10% of that of the lower film 121p and 131p.

The lateral sides of the gate lines 121 and the storage electrode lines 131 are inclined relative to a surface of the substrate 110, and the inclination angle thereof ranges from about 30 to about 80 degrees.

In FIG. 2 and FIG. 3, for the gate electrodes 124, the end portions 129, the storage electrode lines 131, and the storage electrodes 133a and 133b, the lower and upper films thereof are denoted by additional characters p and q, respectively. That is, the gate electrode 124 includes a lower film 124p and an upper film 124q, the end portion includes a lower film 129p and an upper film 129q, the storage electrode line 131 includes a lower film 131p and an upper film 131q, and the storage electrodes 133a and 133b include lower films 133ap, 133bp and upper films 133aq, 133bq, respectively.

A gate insulating layer 140 preferably made of silicon nitride (SiNx) or silicon oxide (SiOx) is disposed on the gate lines 121 and the storage electrode lines 131 and on exposed portions of the substrate 110.

A plurality of semiconductor stripes 151 preferably made of hydrogenated amorphous silicon ("a-Si") or polysilicon are disposed on the gate insulating layer 140. Each of the semiconductor stripes 151 extends substantially in the longitudinal direction, a second direction which may be substantially perpendicular to the first direction, and includes a plurality of projections 154 branching out toward the gate electrodes 124. The semiconductor stripes 151 become wide near the gate lines 121 and the storage electrode lines 131 such that the semiconductor stripes 151 cover large areas of the gate lines 121 and the storage electrode lines 131.

A plurality of ohmic contact stripes and islands 161 and 165 are disposed on the semiconductor stripes 151. The ohmic contacts 161 and 165 are preferably made of n+ hydrogenated a-Si heavily doped with an n-type impurity such as phosphorous, or they may be made of silicide. Each of the ohmic contact stripes 161 includes a plurality of projections 163, and the projections 163 and the ohmic contact islands 165 are located in pairs on projections 154 of the semiconductor stripes 151.

The lateral sides of the semiconductor stripes 151 and the ohmic contacts 161 and 165 are inclined relative to the surface of the substrate 110, and the inclination angles thereof are preferably in a range of about 30 to about 80 degrees.

A plurality of data lines 171 and a plurality of drain electrodes 175 are disposed on the ohmic contacts 161 and 165 and the gate insulating layer 140.

The data lines 171 transmit data signals and extend substantially in the longitudinal direction to intersect the gate lines 121. Each of the data lines 171 also intersects the storage electrode lines 131, and runs between adjacent pairs of storage electrodes 133a and 133b. Each data line 171 includes a plurality of source electrodes 173 projecting toward the gate electrodes 124 and curved like a character J, or my be substantially U-shaped or C-shaped, and an end portion 179 for contact with another layer or an external driving circuit. A data driving circuit (not shown) for generating the data signals may be mounted on an FPC film (not shown), which may be attached to the substrate 110, directly mounted on the substrate 110, or integrated with the substrate 110. The data lines 171 may extend to be connected to a driving circuit that may be integrated with the substrate 110.

The drain electrodes 175 are separated from the data lines 171 and disposed opposite the source electrodes 173 with respect to the gate electrodes 124. Each of the drain electrodes 175 includes a wide end portion and a narrow end portion. The wide end portion overlaps a storage electrode line 131 and the narrow end portion is partly enclosed by a source electrode 173.

A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data line 171 and the drain electrode 175 have a triple-layered structure including a lower film 171p and 175p, an intermediate film 171q and 175q, and an upper film 171r and 175r. In FIG. 2 and FIG. 3, for the data line 171 and the end portion 179, the source electrodes 173 and the drain electrode 175, the lower, intermediate, and upper films thereof are denoted by additional characters p, q, and r, respectively. That is, the end portion 179 includes a lower film 179p, an intermediate film 179q, and an upper film 179r, and the source electrode 173 includes a lower film 173p, an intermediate film 173q, and an upper film 173r. The lower film 171p and 175p may be made of a refractory metal such as Cr, Mo, Ta, Ti, or alloys thereof, the intermediate film 171q and 175q may be made of a low resistivity metal including an Al-containing metal for reducing signal delay or voltage drop, and the upper film 171r and 175r may be made of an oxide layer including an Al-containing metal.

The lower film 171p and 175p of the data line 171 and the drain electrode 175 may contribute to blocking the diffusion of Al atoms of the intermediate film 171q and 175q into the semiconductors 151 and 154 or ohmic contacts 161 and 165. In this context, the lower film 171p and 175p may be regarded as a diffusion barrier layer.

The intermediate film 171q and 175q and the upper film 171r and 175r of the data line 171 and the drain electrode 175 include the same aluminum alloy material because they are deposited by sputtering using the same aluminum alloy target. Here, the aluminum alloy includes aluminum and nickel (Ni). In addition, the aluminum alloy may include at least one of copper (Cu), boron (B), cerium (Ce), and lanthanum (La).

The upper film 171r and 175r may contribute to enhancing contact characteristic of the intermediate film 171q and 175q including aluminum.

The thickness of the upper film 171r and 175r may be about 5% to about 50% of that of the intermediate film 171q and 175q, and more particularly may be about 10% of that of the intermediate film 171q and 175q.

The data lines 171 and the drain electrodes 175 have inclined edge profiles, and the inclination angles thereof range from about 30 to 80 degrees.

The ohmic contacts 161 and 165 are interposed only between the underlying semiconductor stripes 151 and the overlying conductors 171 and 175 thereon, and reduce the contact resistance therebetween. Although the semiconductor stripes 151 are narrower than the data lines 171 at most places, the width of the semiconductor stripes 151 becomes large near the gate lines 121 and the storage electrode lines 131 as described above, to smooth the profile of the surface, thereby preventing disconnection of the data lines 171. However, the semiconductor stripes 151 include some exposed portions, which are not covered with the data lines 171 and the drain electrodes 175, such as portions located between the source electrodes 173 and the drain electrodes 175.

A passivation layer 180 is disposed on the data lines 171, the drain electrodes 175, and the exposed portions of the semiconductor stripes 151. The passivation layer 180 may be made of an inorganic insulator or organic insulator, and it may have a flat or substantially flat top surface. Examples of the inorganic insulator include silicon nitride and silicon oxide. The organic insulator may have photosensitivity and a dielectric constant of less than about 4.0. However, the passivation layer 180 may include a lower film of an inorganic insulator and an upper film of an organic insulator.

The passivation layer 180 has a plurality of contact holes 182 and 185 exposing the end portions 179 of the data lines 171 and the drain electrodes 175, respectively. The passivation layer 180 and gate insulating layer 140 have a plurality of contact holes 181 exposing the end portions 129 of the gate lines 121, a plurality of contact holes 183 exposing portions of the storage electrode lines 131 near the fixed end portions of the first storage electrodes 133a, and a plurality of contact holes 184 exposing the linear branches of the free end portions of the first storage electrodes 133a.

A plurality of pixel electrodes 191, a plurality of overpasses 83, and a plurality of contact assistants 81 and 82 are disposed on the passivation layer 180. They are preferably made of a transparent conductor such as ITO or IZO.

The pixel electrodes 191 are physically and electrically connected to the drain electrodes 175 through the contact holes 185 such that the pixel electrodes 191 receive data voltages from the drain electrodes 175. The pixel electrodes 191 supplied with the data voltages generate electric fields in cooperation with a common electrode (not shown) of an opposing display panel (not shown) supplied with a common voltage, which determine the orientations of liquid crystal molecules (not shown) of a liquid crystal layer (not shown) disposed between the pixel electrodes 191 and common electrode. A pixel electrode 191 and the common electrode form a capacitor referred to as a "liquid crystal capacitor," which stores applied voltages after the TFT is turned off.

A pixel electrode 191 and a drain electrode 175 connected thereto overlap a storage electrode line 131 including storage electrodes 133a and 133b. The pixel electrode 191, a drain electrode 175 connected thereto, and the storage electrode line 131 form an additional capacitor referred to as a "storage capacitor," which enhances the voltage storing capacity of the liquid crystal capacitor.

The contact assistants 81 and 82 are connected to the end portions 129 and 179 of the gate line 121 and the data line 171, respectively. The contact assistants 81 and 82 protect the end portions 129 and 179 of the gate line 121 and the data line 171 and enhance the adhesion between the end portions 129 and 179 and external devices.

The overpasses 83 cross over the gate lines 121 and are connected to the exposed portions of the fixed end portions of the first storage electrodes 133a and the exposed linear branches of the free end portions of the storage electrodes 133a through the contact holes 183 and 184, respectively, which are disposed opposite each other with respect to the gate lines 121. The storage electrode lines 131 including the storage electrodes 133a and 133b along with the overpasses 83 can be used for repairing defects in the gate lines 121, the data lines 171, or the TFTs.

As described above, in the TFT array panel according to an exemplary embodiment of the present invention, the gate line 121 and the storage electrode line 131 include the lower film 121p and 131p of an aluminum containing metal and the upper film 121q and 131q of an oxide layer of the metal, which are formed by using the same metal target containing aluminum so that they include the same aluminum alloy in the same sputtering chamber. In addition, the data line 171 and the drain electrode 175 include the lower film 171p and 175p of a refractory metal. The data line 171 and the drain electrode 175 also include the intermediate film 171q and 175q of an Al-containing metal and the upper film 171r and 175r of an oxide layer of the metal, which are formed by using the same metal target containing aluminum so that they include the same aluminum alloy in the same sputtering chamber.

The upper film 121q and 131q of the gate line 121 and the storage electrode line 131 and the upper film 171r and 175r of the data line 171 and the drain electrode 175 improve and enhance the contact characteristic between all of the lower film 129p of the end portion 129, the intermediate film 179q of the end portion 179, the lower films 133ap and 133bp of the storage electrodes 133a and 133b, and the intermediate film 175q of the drain electrode 175, and ITO or IZO, of the contact assistants 81 and 82, the overpasses 83, and the pixel electrodes 191, which contact through the contact holes 181, 182, 183, 184, and 185.

Accordingly, the contact assistants 81 and 82, the overpass 83, and the pixel electrode 191 made of ITO or IZO may be prevented from tacking off from the signal lines made of an aluminum containing metal.

Now, an exemplary method of manufacturing the exemplary TFT array panel shown in FIGS. 1 to 3 according to an exemplary embodiment of the present invention will be described in detail with reference to FIG. 4 to FIG. 15 along with FIGS. 1 to 3.

Figure 4:
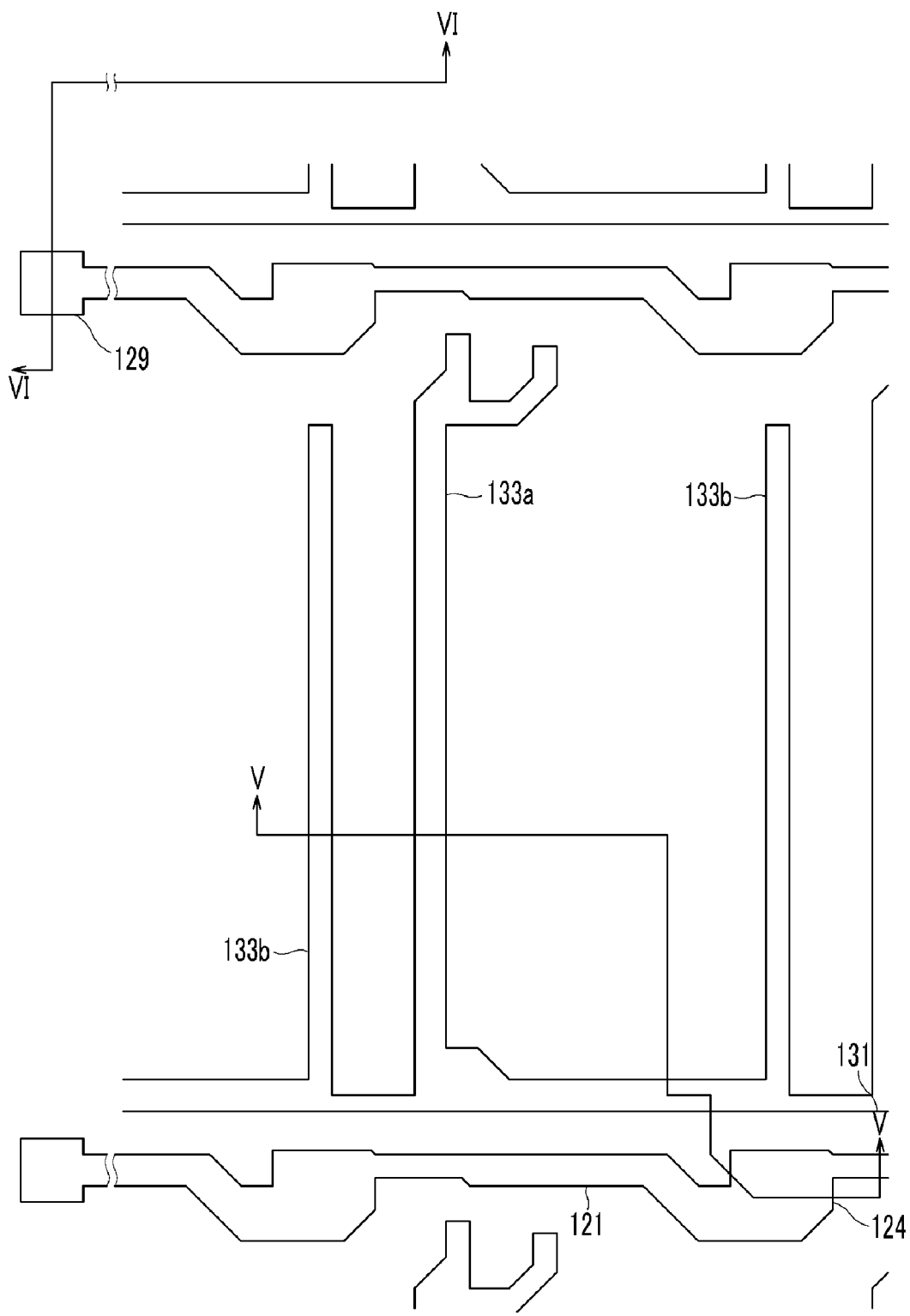
FIG. 4, FIG. 7, FIG. 10, and FIG. 13 are layout views of the exemplary TFT array panel in intermediate steps of an exemplary manufacturing method thereof according to an exemplary embodiment of the present invention.
Figure 5:
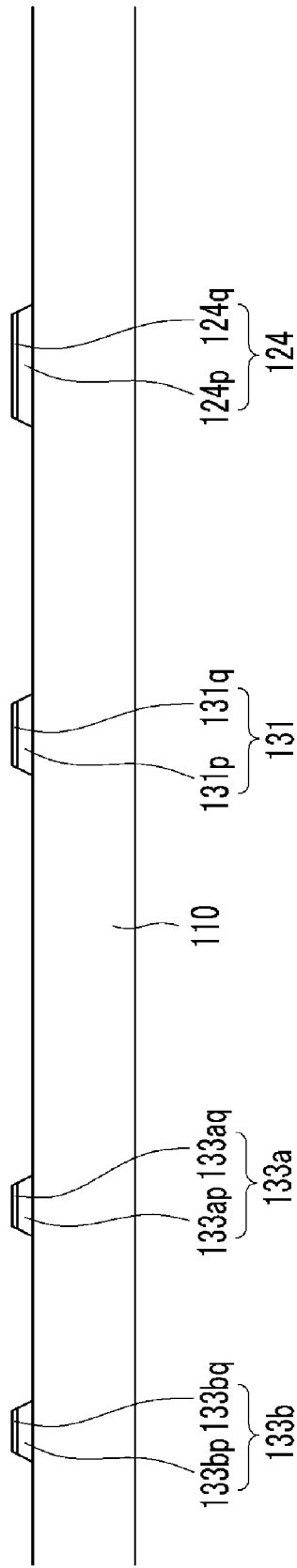
FIG. 5 and FIG. 6 are sectional views of the exemplary TFT array panel shown in FIG. 4 taken along lines V-V and VI-VI, respectively.
Figure 6:
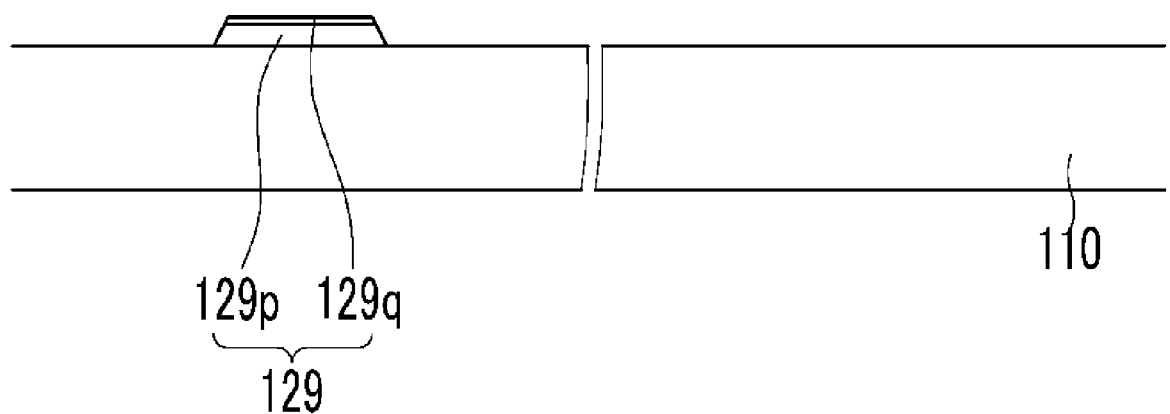
Figure 7:
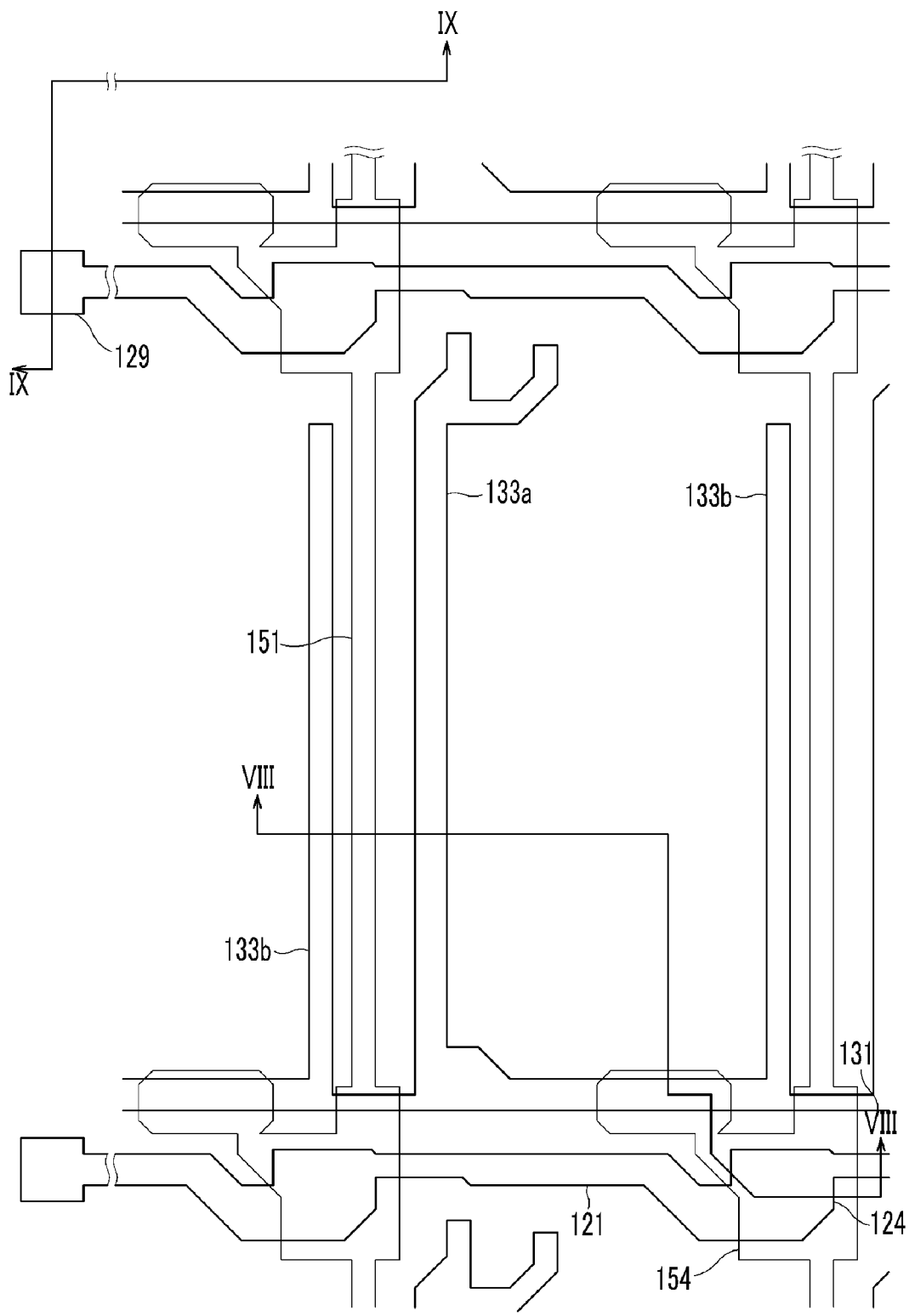
Figure 8:
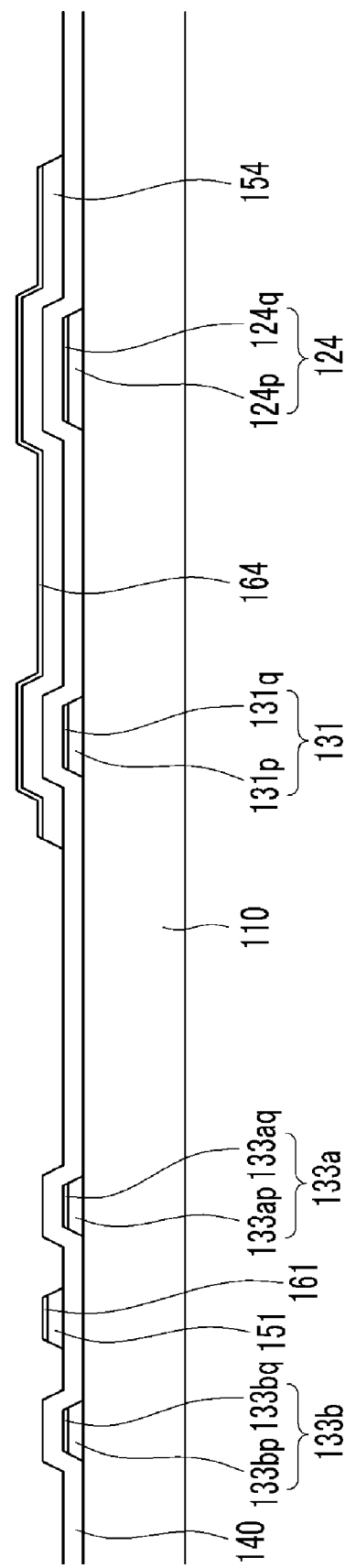
FIG. 8 and FIG. 9 are sectional views of the exemplary TFT array panel shown in FIG. 7 taken along lines VIII-VIII and IX-IX, respectively.
Figure 9:
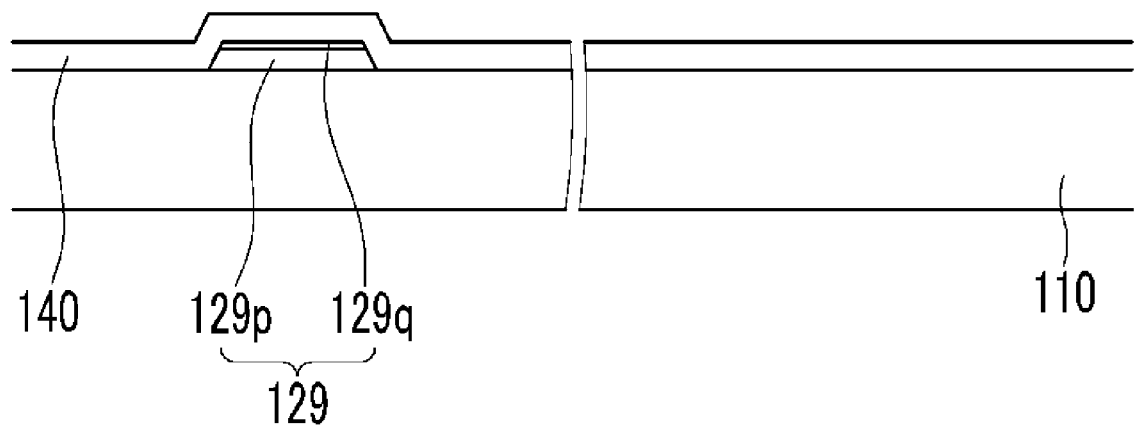
Figure 10:
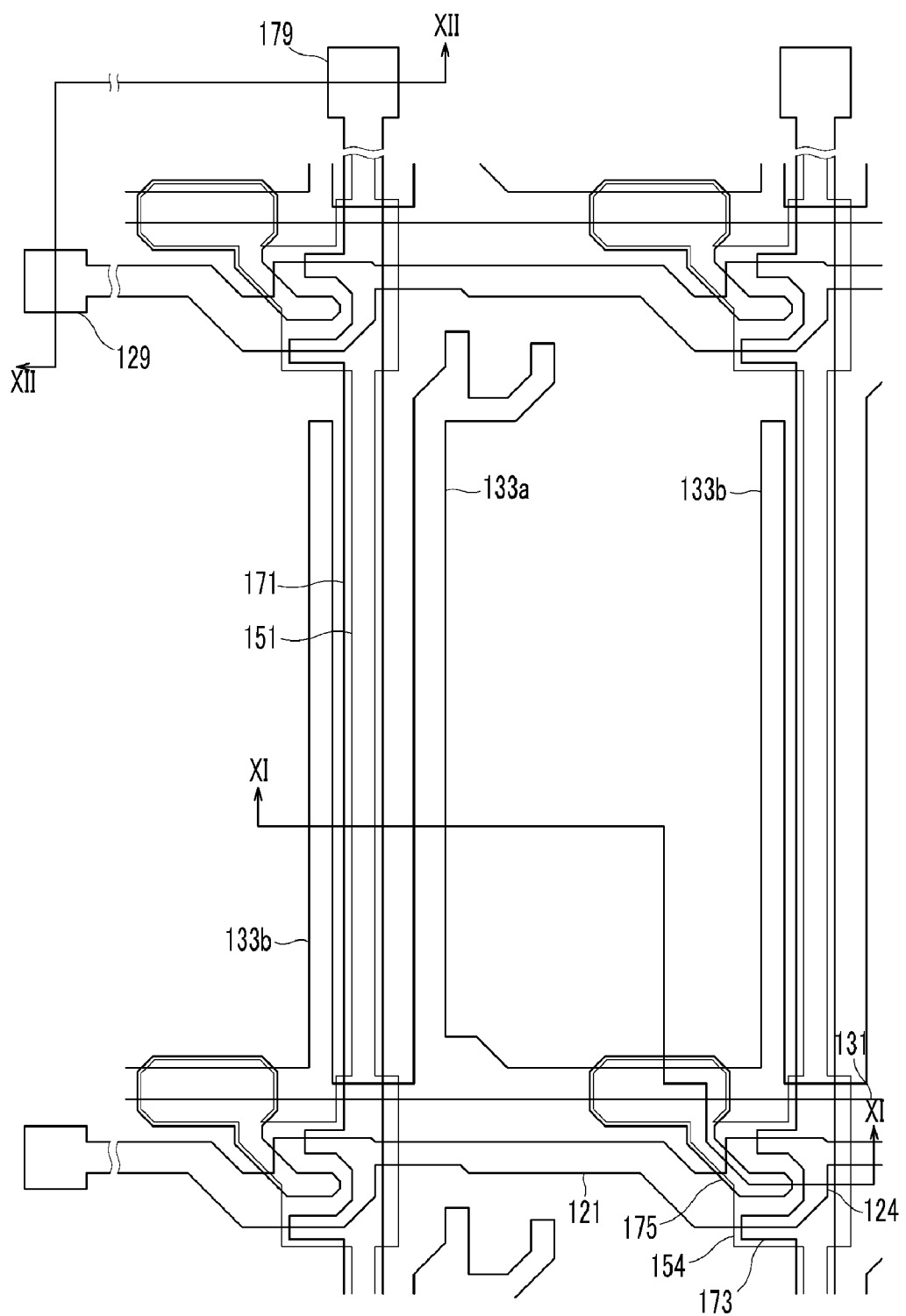
Figure 11:
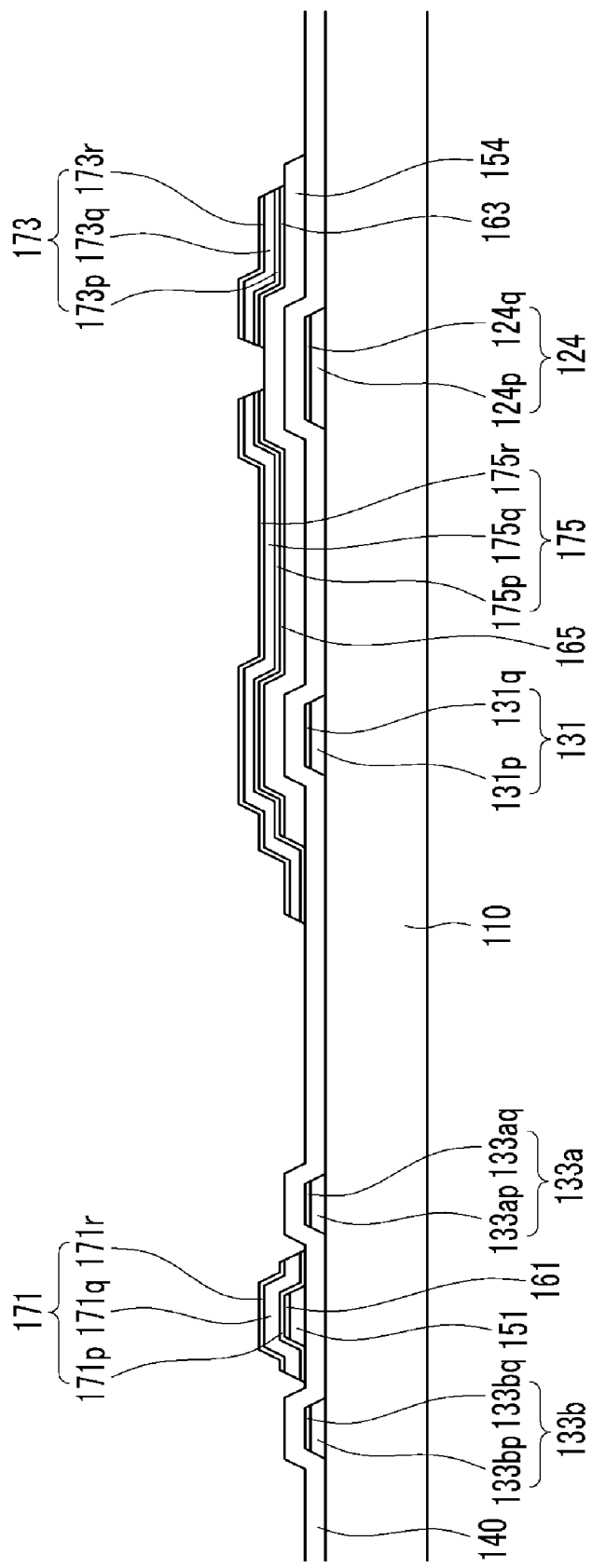
FIG. 11 and FIG. 12 are sectional views of the exemplary TFT array panel shown in FIG. 10 taken along lines XI-XI and XII-XII, respectively.
Figure 12:
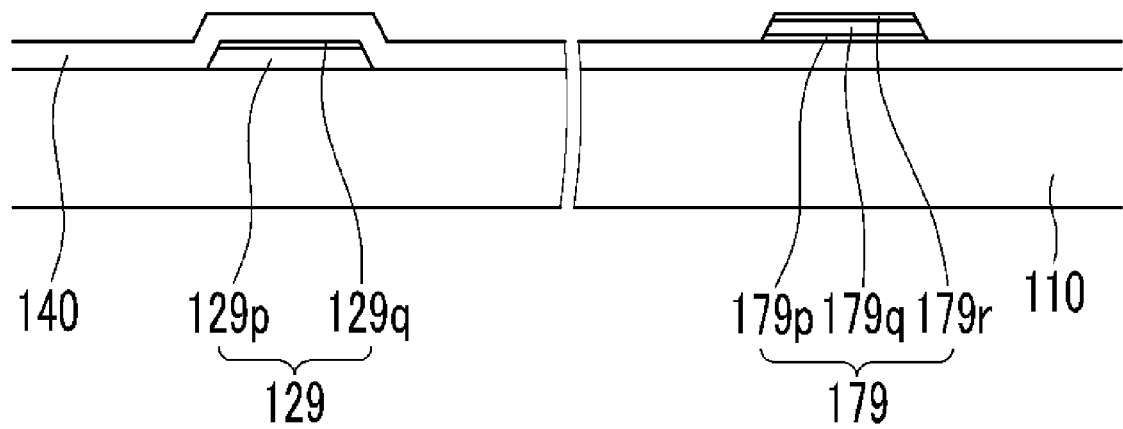
Figure 13:
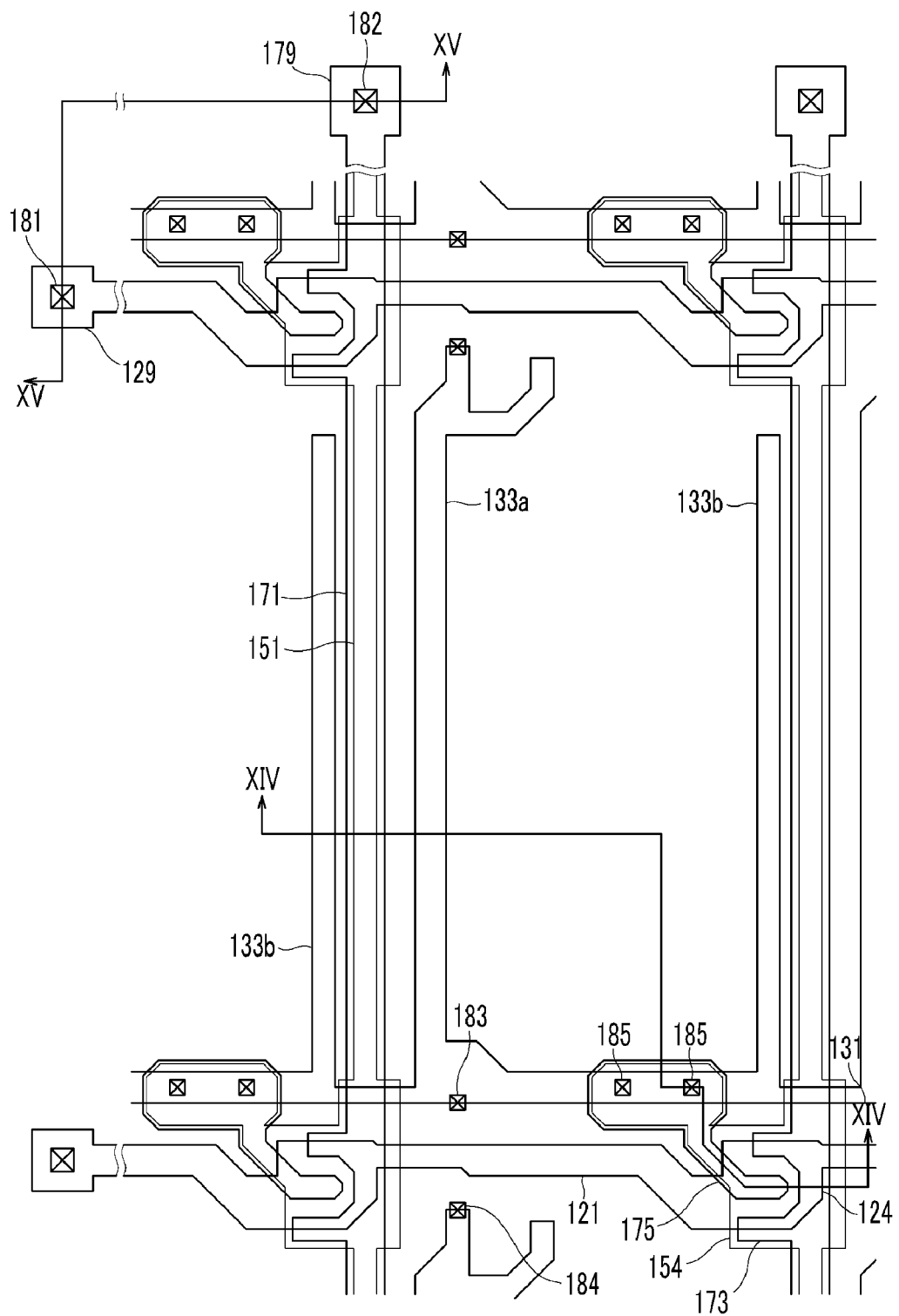
Figure 14:
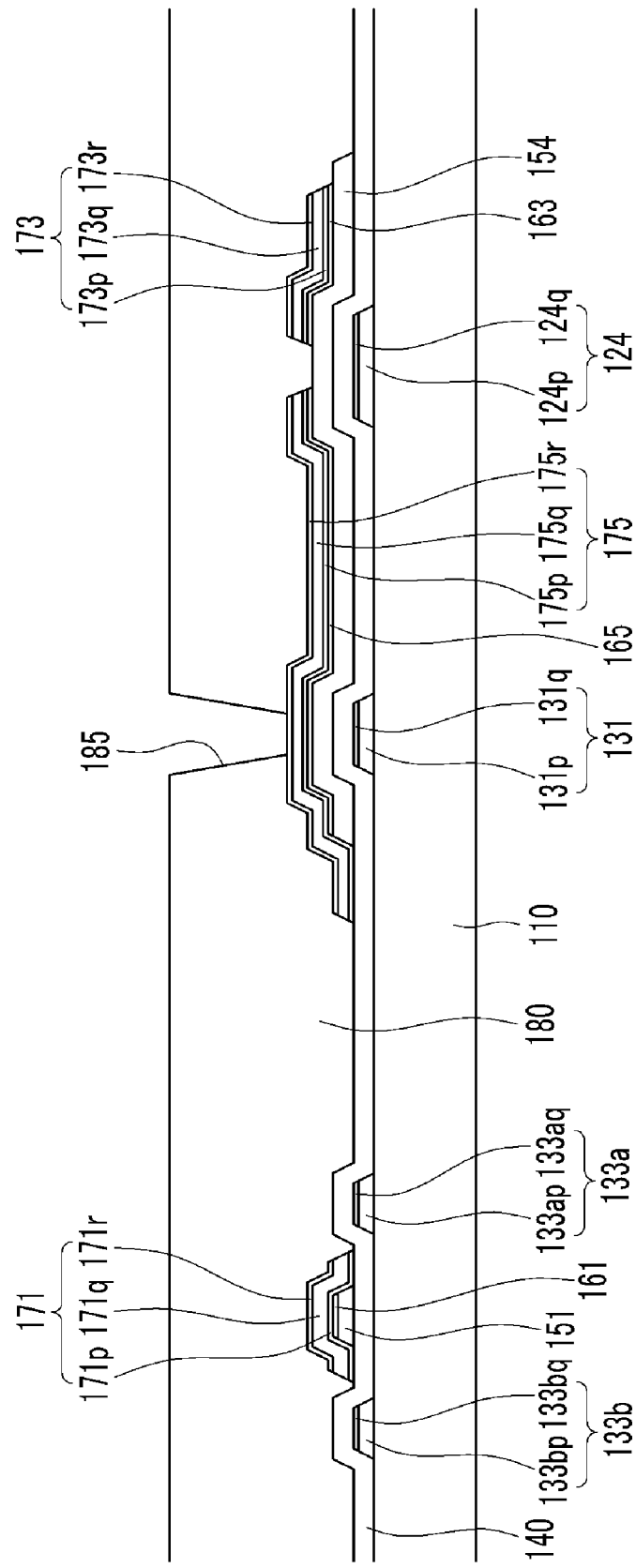
FIG. 14 and FIG. 15 are sectional views of the exemplary TFT array panel shown in FIG. 13 taken along lines XIV-XIV and XV-XV, respectively.
Figure 15:
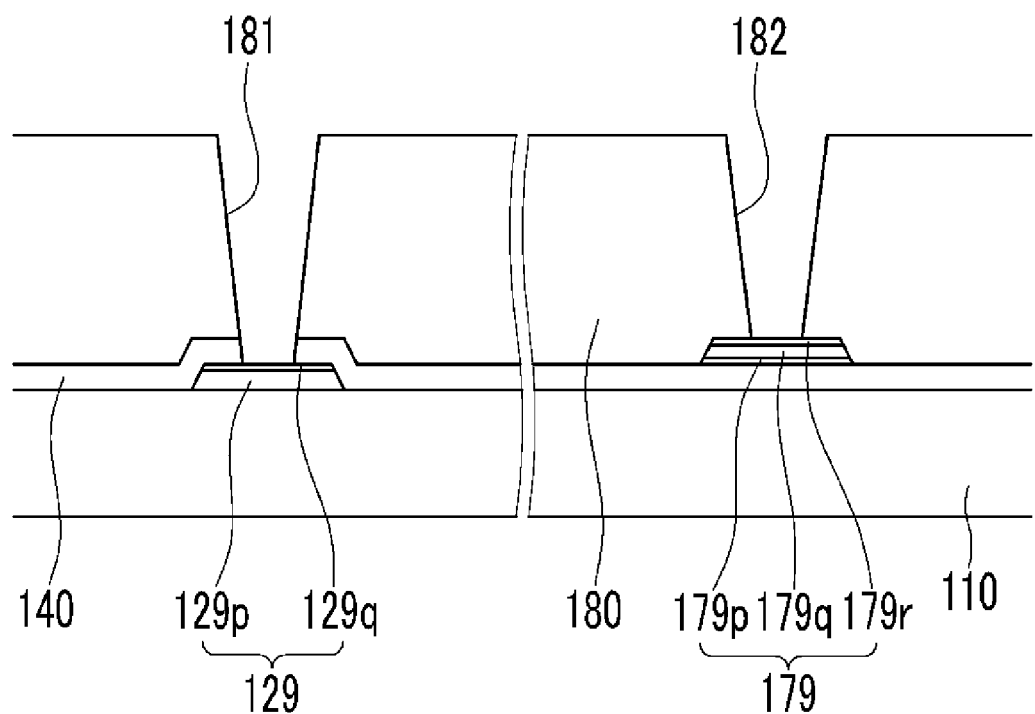

FIG. 4, FIG. 7, FIG. 10, and FIG. 13 are layout views of the exemplary TFT array panel in intermediate steps of an exemplary manufacturing method thereof according to an exemplary embodiment of the present invention, FIG. 5 and FIG. 6 are sectional views of the exemplary TFT array panel shown in FIG. 4 taken along lines V-V and VI-VI, respectively, FIG. 8 and FIG. 9 are sectional views of the exemplary TFT array panel shown in FIG. 7 taken along lines VIII-VIII and IX-IX, respectively, FIG. 11 and FIG. 12 are sectional views of the exemplary TFT array panel shown in FIG. 10 taken along lines XI-XI and XII-XII, respectively, and FIG. 14 and FIG. 15 are sectional views of the exemplary TFT array panel shown in FIG. 13 taken along lines XIV-XIV and XV-XV, respectively.

Referring to FIG. 4 to FIG. 6, a plurality of gate lines 121 including gate electrodes 124 and end portions 129 and a plurality of storage electrode lines 131 including storage electrodes 133a and 133b are formed on the insulation substrate 110. In FIG. 4 to FIG. 15, for the gate electrodes 124, the storage electrode lines 131, and the storage electrodes 133a and 133b, the lower and upper films thereof are denoted by additional characters p and q, respectively, as previously described.

Firstly, a metal film including an Al-containing metal is deposited on an insulating substrate 110 by sputtering when using a target containing aluminum (Al) and an atmosphere gas of argon (Ar) gas. Thereafter, an oxide layer of an Al-containing metal is deposited on the metal film by sputtering in the same sputtering chamber and using the same target, and an atmosphere gas of oxygen ($O_2$) gas as well as argon (Ar) gas. Here, the argon gas and the oxygen gas are in a ratio of about 1:1 to about 10:1.

Next, the oxide layer and the metal film are patterned, such as by photolithography and etching, to form a plurality of gate lines 121 including gate electrodes 124 and end portions 129 and a plurality of storage electrode lines 131 including storage electrodes 133a and 133b.

Here, the target containing aluminum (Al) may be an aluminum alloy including aluminum (Al) and nickel (Ni). In addition, the target may further include at least one of copper (Cu), boron (B), cerium (Ce), and lanthanum (La). The thickness of the upper film 121q and 131q of the gate line 121 and the storage electrode line 131 may be about 5% to about 50% of that of the lower film 121p and 131p, and more particularly may be about 10% of that of the lower film 121p and 131p of the gate line 121 and the storage electrode line 131.

Referring to FIG. 7 to FIG. 9, a gate insulating layer 140 is deposited, and then a plurality of intrinsic semiconductor stripes 151 including projections 154, and a plurality of extrinsic semiconductor stripes 161 including projections 164 are formed thereon.

Referring to FIG. 10 to FIG. 12, a plurality of data lines 171 including source electrodes 173 and end portions 179 and a plurality of drain electrodes 175 are formed. In FIG. 10 to FIG. 15, for the data line 171, the source electrodes 173, and the drain electrode 175, the lower, intermediate, and upper films thereof are denoted by additional characters p, q, and r, respectively.

Firstly, a lower metal film including a refractory metal such as molybdenum (Mo), chromium (Cr), tantalum (Ta), and titanium (Ti) is deposited. Then, an upper metal film including an Al-containing metal is deposited by sputtering in using a target containing aluminum (Al) and an atmosphere gas of argon (Ar) gas. Thereafter, an oxide layer of the Al-containing metal is deposited on the metal film by sputtering in the same sputtering chamber and using the same target, and an atmosphere gas of oxygen ($O_2$) gas as well as argon (Ar) gas. Here, the argon gas and the oxygen gas are in a ratio of about 1:1 to about 10:1, and the target containing aluminum (Al) may be an aluminum alloy including aluminum (Al) and nickel (Ni). In addition, the target may further include at least one of copper (Cu), boron (B), cerium (Ce), and lanthanum (La).

Next, the oxide layer, the upper metal film, and the lower metal film are patterned, such as by photolithography and etching, to form a plurality of data lines 171 including source electrodes 173 and end portions 179 and a plurality of drain electrodes 175, as shown in FIG. 10 to FIG. 12.

Here, the thickness of the upper film 171r and 175r of the data line 171 and the drain electrode 175 may be about 5% to about 50% of that of the intermediate film 171q and 175q of the data line 171 and the drain electrode 175, and more particularly may be about 10% of that of the intermediate film 171q and 175q.

Thereafter, exposed portions of the extrinsic semiconductor 164, which are not covered with the data lines 171 and the drain electrodes 175, are removed to complete a plurality of ohmic contact stripes 161 including projections 163 and a plurality of ohmic contact islands 165 and to expose portions of the intrinsic semiconductor stripes 151.

Next, a passivation layer 180 is deposited, and sequentially the passivation layer 180 and the gate insulating layer 140 are patterned, such as by photolithography and etching, to form a plurality of contact holes 181, 182, 183, 184, and 185 as shown in FIG. 13 to FIG. 15.

Finally, a transparent conducting layer of ITO or IZO is deposited on the passivation layer 180 by sputtering, etc., and is patterned to form a plurality of pixel electrodes 191, a plurality of contact assistants 81 and 82, and a plurality of overpasses 83 as shown in FIG. 1 to FIG. 3.

Here, the upper film 121q and 131q of the gate line 121 and the storage electrode line 131, respectively, and the upper film 171r and 175r of the data line 171 and the drain electrode 175, respectively, exposed though the contact holes 181, 182, 183, 184, and 185 is made of an oxide layer including aluminum and they improve and enhance the contact characteristic between Al, of the lower film 129p of the end portion 129, the intermediate film 179q of the end portion 179, the lower film 133ap and 133bp of the storage electrode 133a and 133b, and the intermediate film 175q of the drain electrode 175, and ITO or IZO, of the contact assistants 81 and 82, the overpasses 83, and the pixel electrodes 191. Accordingly, the contact assistants 81 and 82, the overpass 83, and the pixel electrode 191 made of ITO or IZO may be prevented from tacking off from the signal lines made of an Al-containing metal.

Figure 16:
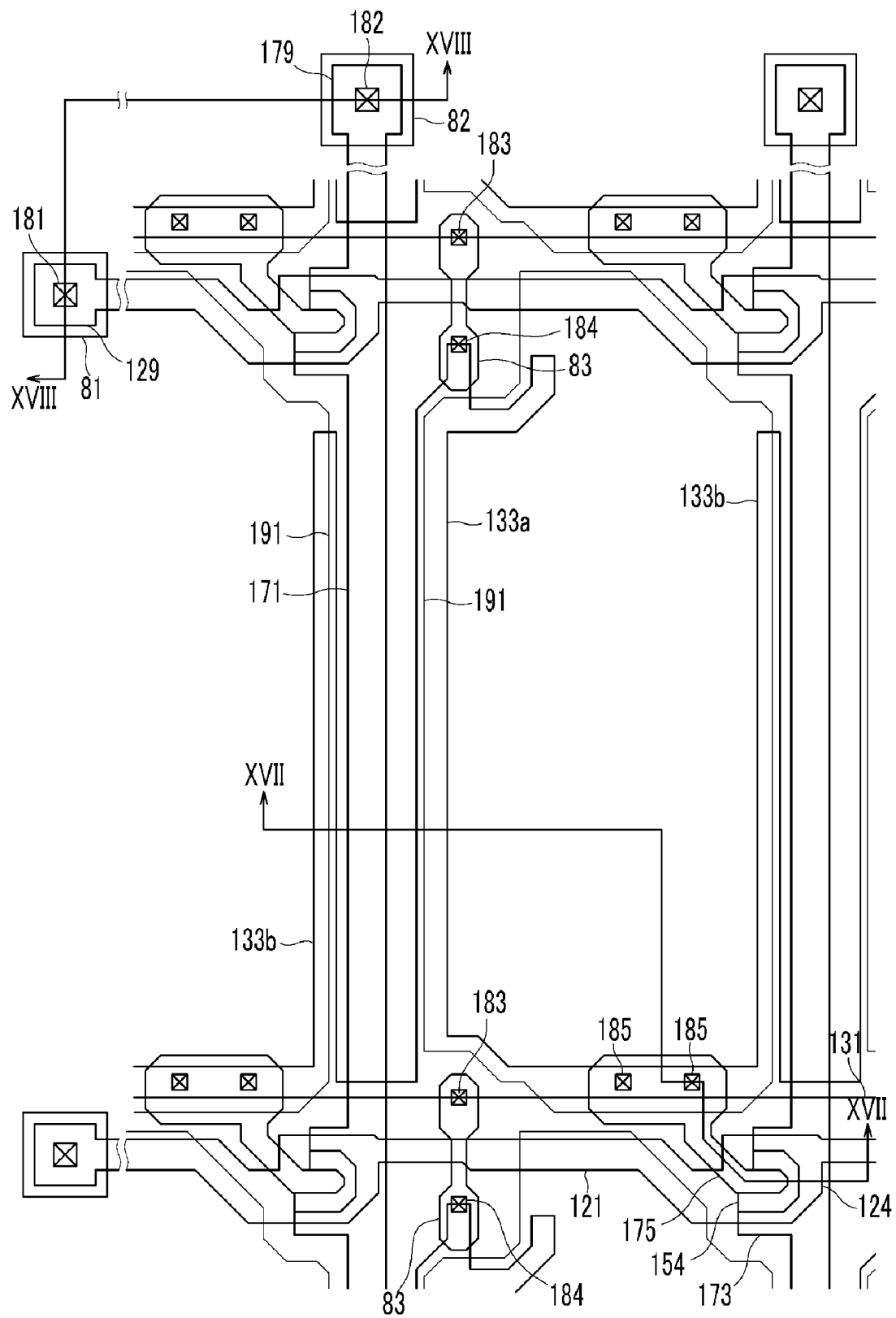
FIG. 16 is a layout view of an exemplary TFT array panel according to another exemplary embodiment of the present invention.

Now, an exemplary TFT array panel according to another exemplary embodiment of the present invention will be described in detail with reference to FIG. 16 to FIG. 18. FIG. 16 is a layout view of an exemplary TFT array panel according to another exemplary embodiment of the present invention, and FIG. 17 and FIG. 18 are sectional views of the exemplary TFT array panel shown in FIG. 16 taken along lines XVII-XVII and XVIII-XVIII, respectively.

Figure 17:
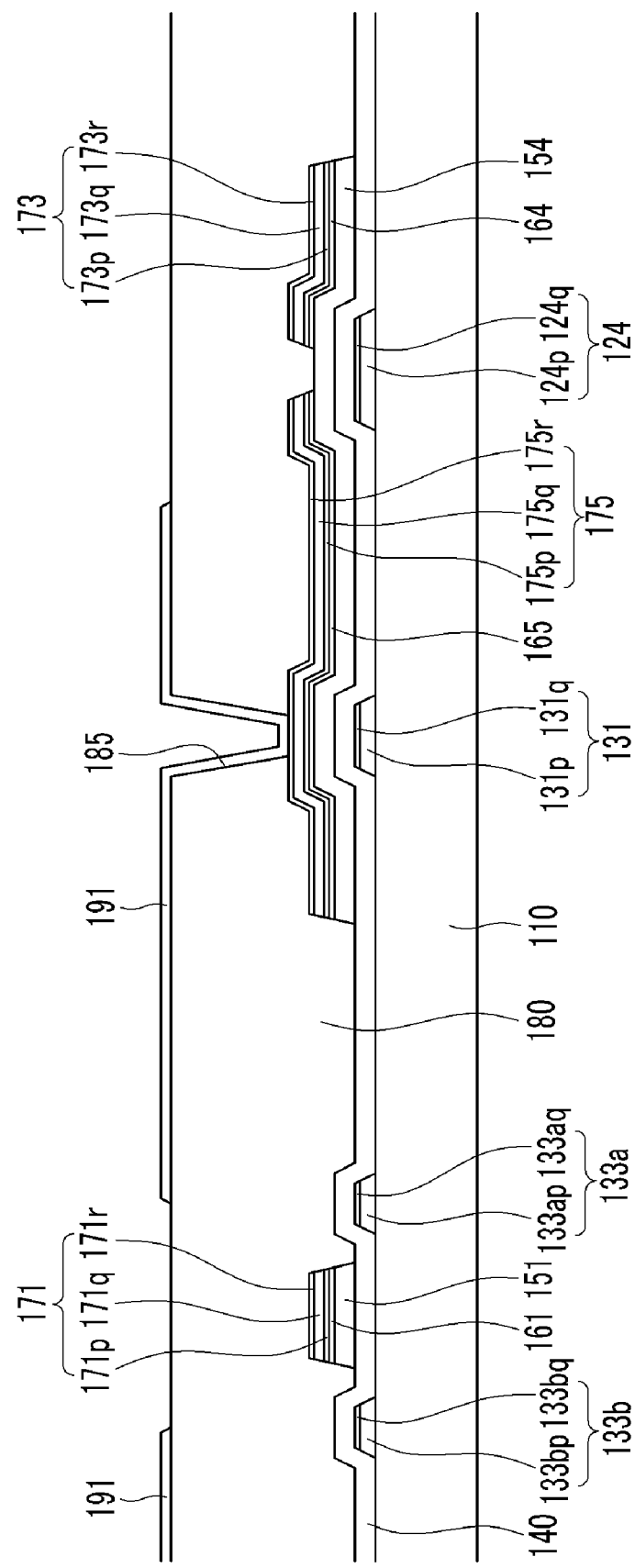
FIG. 17 and FIG. 18 are sectional views of the exemplary TFT array panel shown in FIG. 16 taken along lines XVII-XVII and XVIII-XVIII, respectively.
Figure 18:
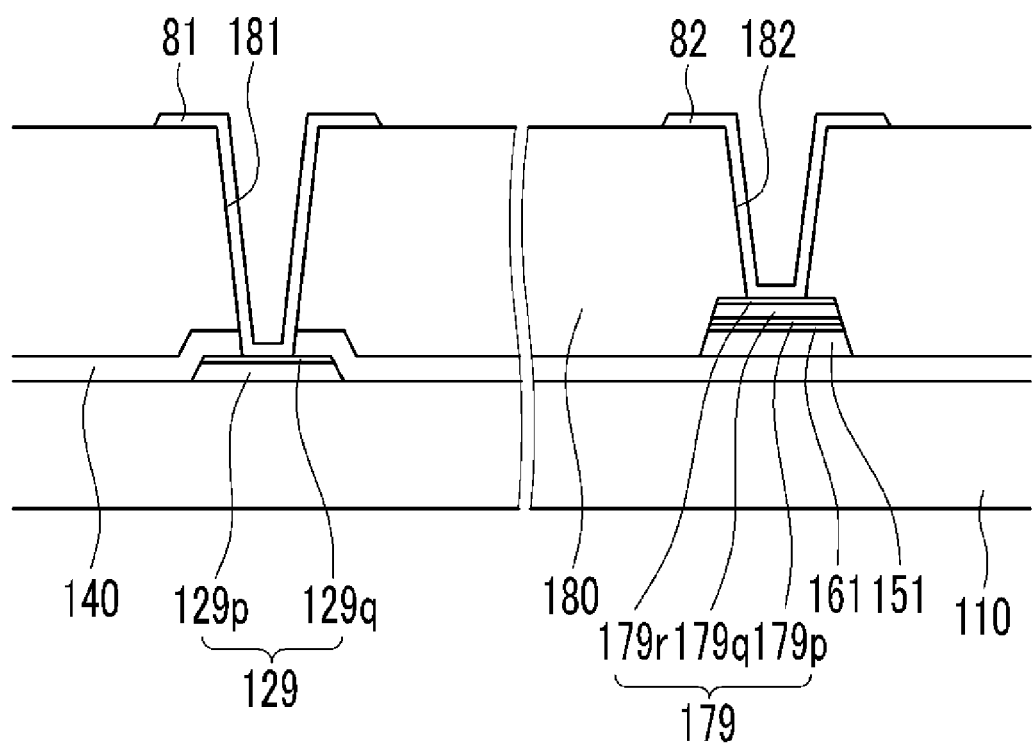

As shown in FIG. 16 to FIG. 18, a layered structure of an exemplary TFT array panel according to the present embodiment is substantially similar to that shown in FIG. 1 to FIG. 3.

A plurality of gate lines 121 including a plurality of gate electrodes 124 and a plurality of end portions 129, and a plurality of storage electrode lines 131 including a plurality of storage electrodes 133a and 133b, are disposed on a substrate 110. A gate insulating layer 140, a plurality of semiconductor stripes 151 including projections 154, a plurality of ohmic contact stripes 161 including projections 164, and a plurality of ohmic contact islands 165 are sequentially disposed on the gate lines 121 and the storage electrode lines 131.

A plurality of data lines 171 including source electrodes 173 and end portions 179 and a plurality of drain electrodes 175 are disposed on the ohmic contacts 161 and 165 and the gate insulating layer 140, and a passivation layer 180 is disposed thereon. The gate insulating layer 140 and the passivation layer 180 have a plurality of contact holes 181, 182, 183, 184, and 185, and a plurality of pixel electrodes 191, a plurality of contact assistants 81 and 82, and a plurality of overpasses 83 are disposed on the passivation layer 180.

However, unlike the TFT array panel shown in FIG. 1 to FIG. 3, the semiconductor stripes 151 have almost the same planar shapes as the data lines 171 and the drain electrodes 175 as well as the ohmic contacts 161 and 165. However, the projections 154 of the semiconductor stripes 151 include some exposed portions, which are not covered by the data lines 171 and the drain electrodes 175, such as portions located between the source electrodes 173 and the drain electrodes 175.

The gate line 121 and the storage electrode line 131 of the TFT panel according to this embodiment also have a double-layered structure including a lower film 121p and 131p made of a low resistivity metal including an Al-containing metal for reducing signal delay or voltage drop, and an upper film 121q and 131q made of an oxide layer including an Al-containing metal. The lower film 121p and 131p and the upper film 121q and 131q include the same aluminum alloy material because the lower film 121p and 131p and the upper film 121q and 131q are deposited by sputtering using the same aluminum alloy target. The upper film 121q and 131q may contribute to enhancing the contact characteristic of the lower film 121p and 131p including aluminum (Al). The thickness of the upper film 121q and 131q may be about 5% to about 50% of that of the lower film 121p and 131p, and more particularly may be about 10% of that of the lower film 121p and 131p.

In addition, the data line 171 and the drain electrode 175 of the TFT panel according to this embodiment also includes a lower film 171p and 175p made of refractory metal such as Cr, Mo, Ta, Ti, or alloys thereof, an intermediate film 171q and 175q made of a low resistivity metal including an Al-containing metal for reducing signal delay or voltage drop, and an upper film 171r and 175r made of an oxide layer including an Al-containing metal. The intermediate film 171q and 175q and the upper film 171r and 175r of the data line 171 and the drain electrode 175, respectively, include the same aluminum alloy material because they are deposited by sputtering using the same aluminum alloy target. The lower film 171p and 175p of the data line 171 and the drain electrode 175 may contribute to blocking the diffusion of Al atoms of the intermediate film 171q and 175q into the semiconductors 151 and 154 or ohmic contacts 161 and 165. In this context, the lower film 171p and 175p may be regarded as a diffusion barrier layer, and the upper film upper film 171r and 175r may contribute to enhancing the contact characteristic of the intermediate film 171q and 175q including aluminum (Al). The thickness of the upper film 171r and 175r may be about 5% to about 50% of that of the intermediate film 171q and 175q, and more particularly may be about 10% of that of the intermediate film 171q and 175q.

Many characteristics of the exemplary TFT array panel shown in FIG. 1 to FIG. 3 can be applied to the exemplary TFT array panel shown in FIG. 16 to FIG. 18.

Now, an exemplary manufacturing method of the exemplary TFT array panel shown in FIG. 16 to FIG. 18 according to the another exemplary embodiment of the present invention will be described in detail with reference to FIG. 19 to FIG. 27 along with FIG. 16 to FIG. 18.

Figure 19:
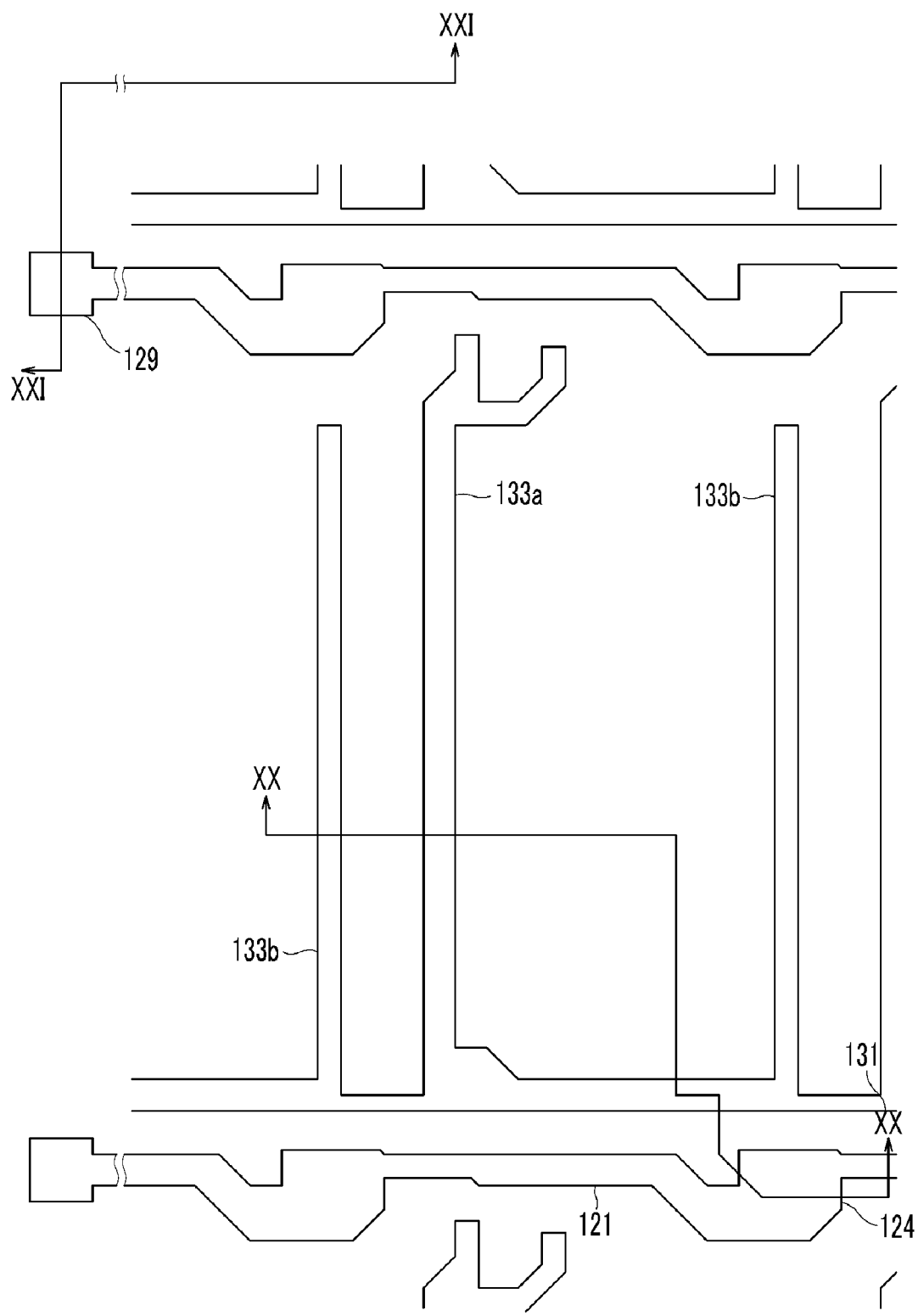
FIG. 19, FIG. 22, and FIG. 25 are layout views of the exemplary TFT array panel in intermediate steps of an exemplary manufacturing method thereof according to another exemplary embodiment of the present invention.
Figure 20:
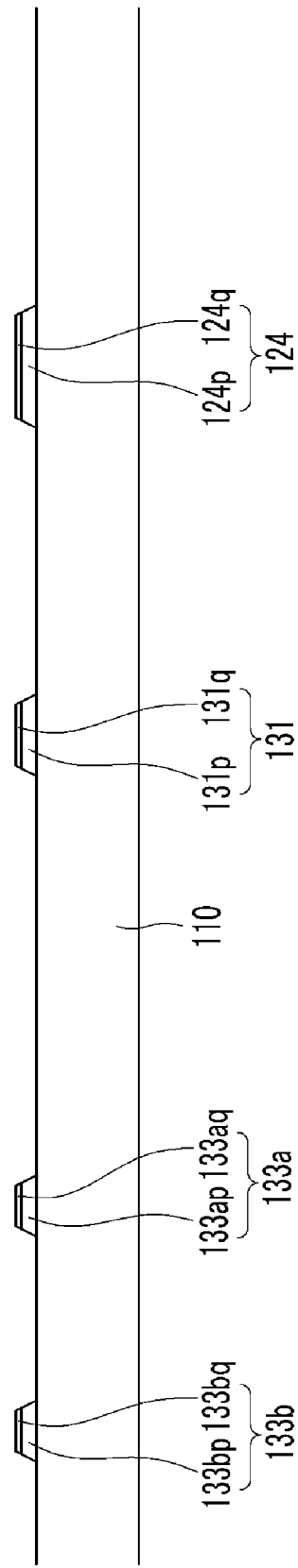
FIG. 20 and FIG. 21 are cross-sectional views of the exemplary TFT array panel shown in FIG. 19 taken along lines XX-XX and XXI-XXI, respectively.
Figure 21:
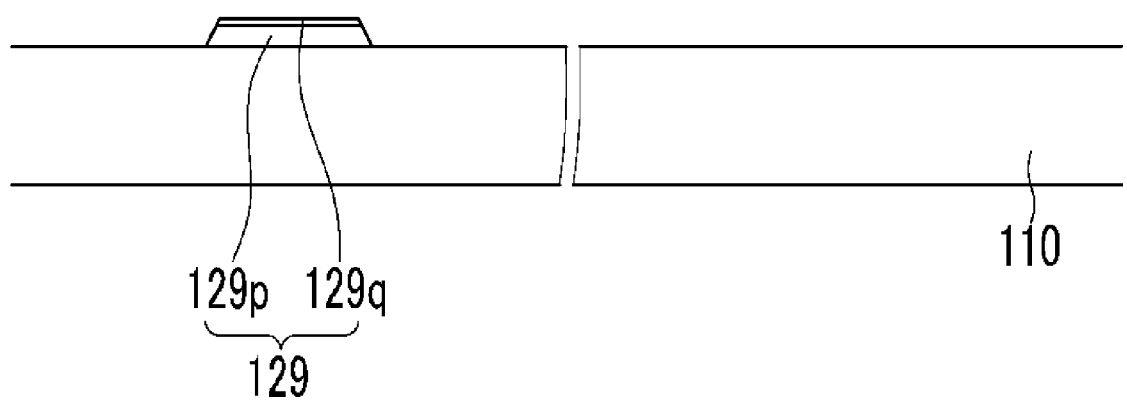
Figure 22:
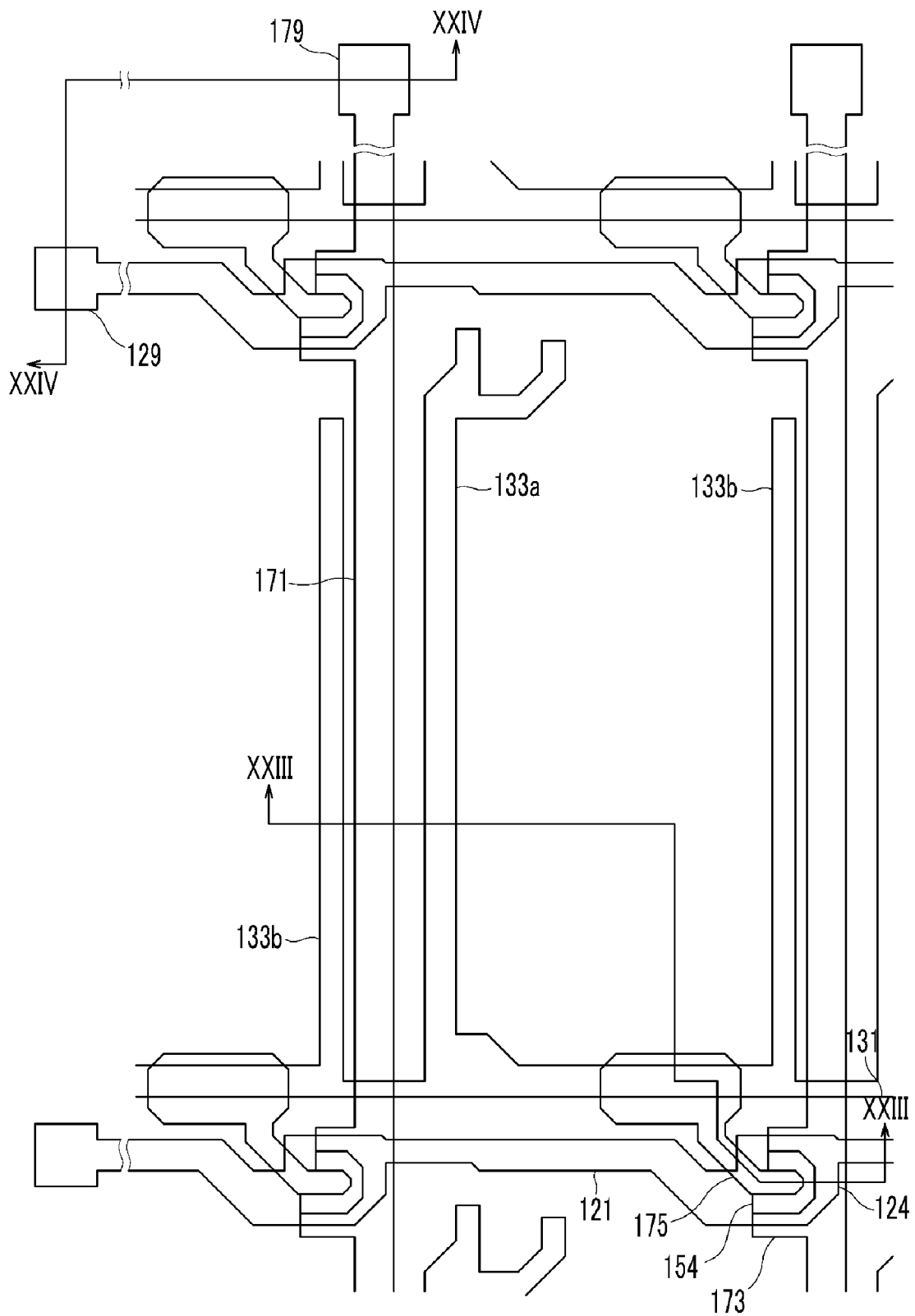
Figure 23:
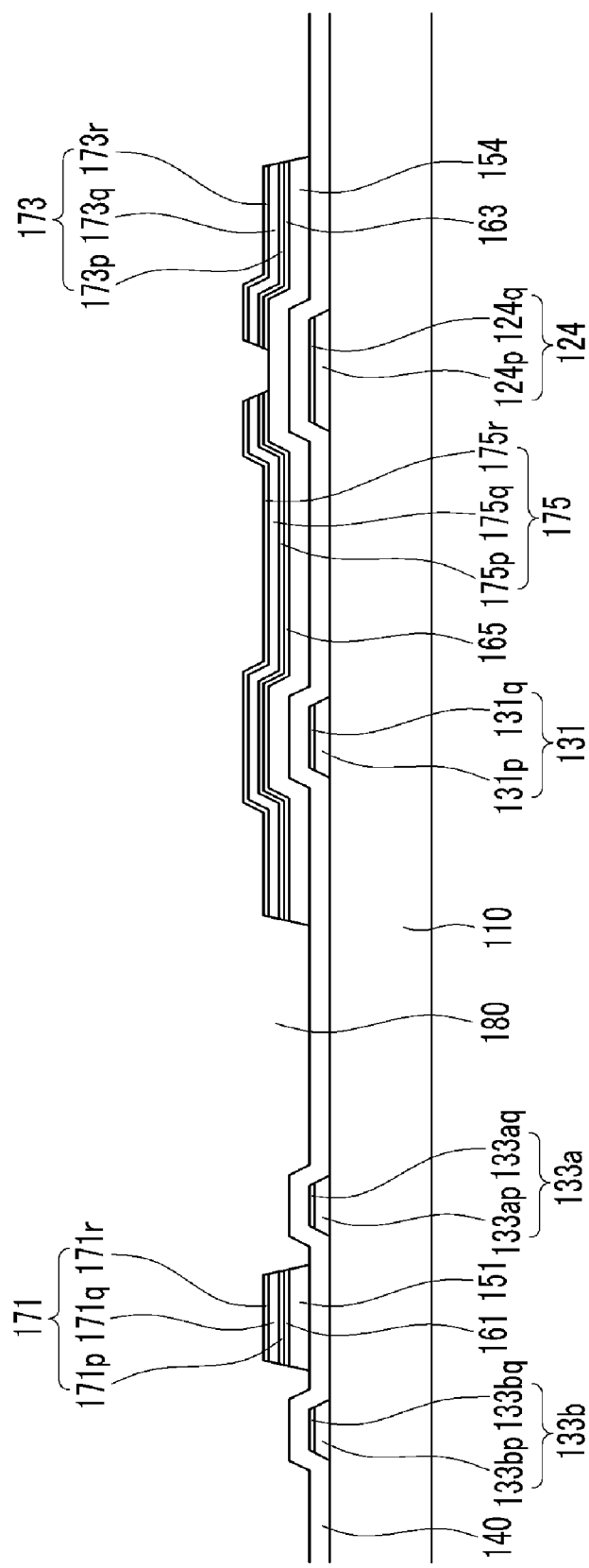
FIG. 23 and FIG. 24 are cross-sectional views of the exemplary TFT array panel shown in FIG. 22 taken along lines XXIII-XXIII and XXIV-XXIV, respectively.
Figure 24:
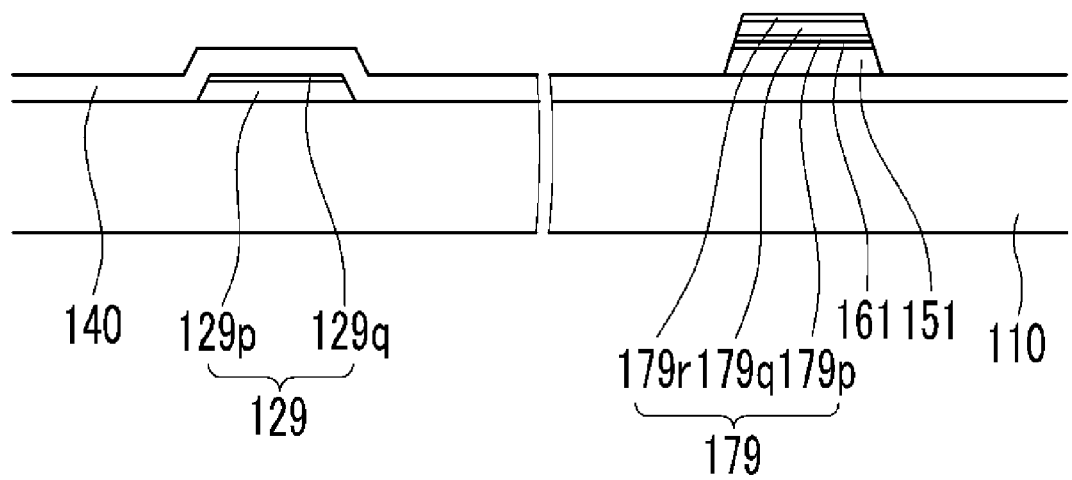
Figure 25:
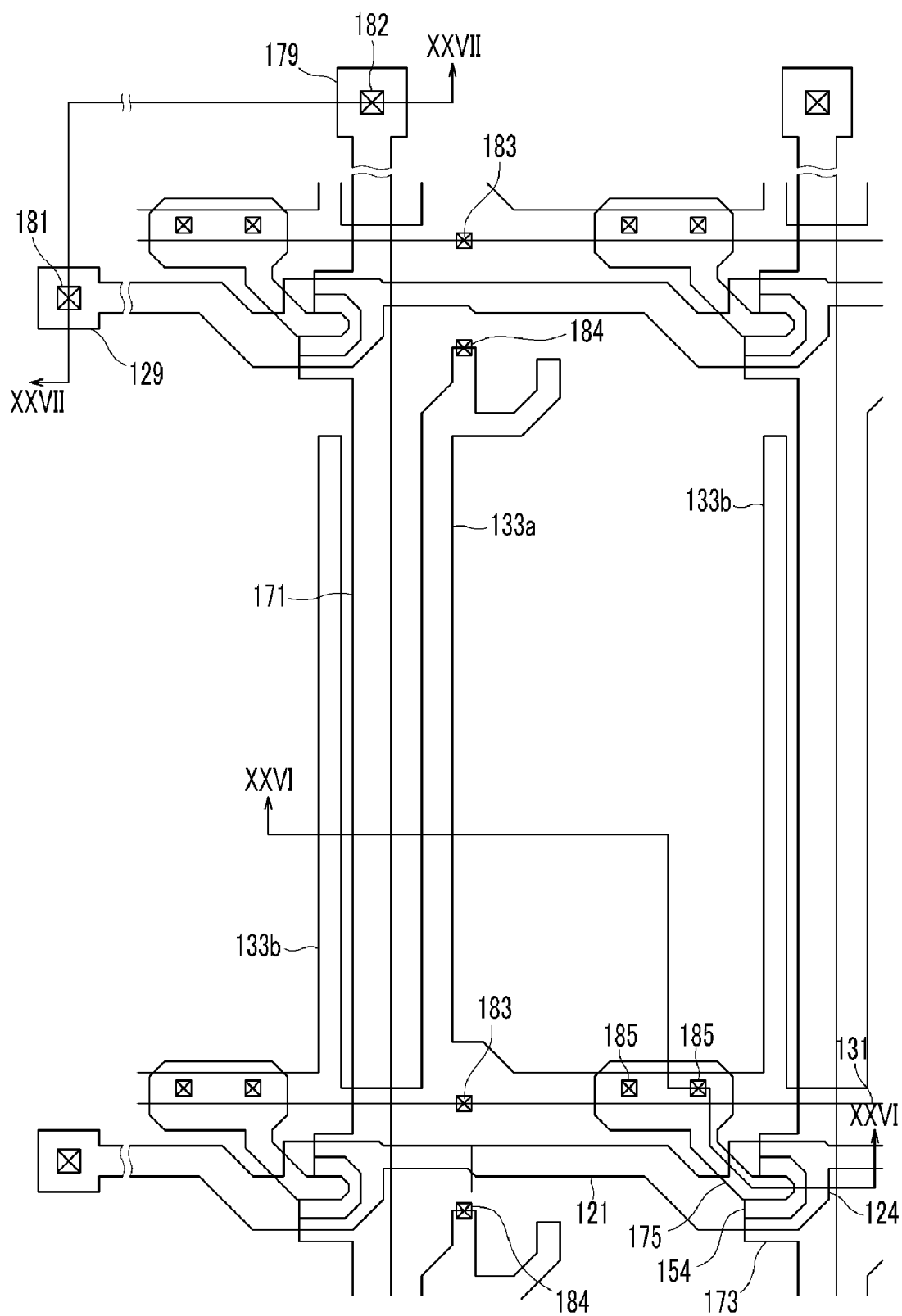
Figure 26:
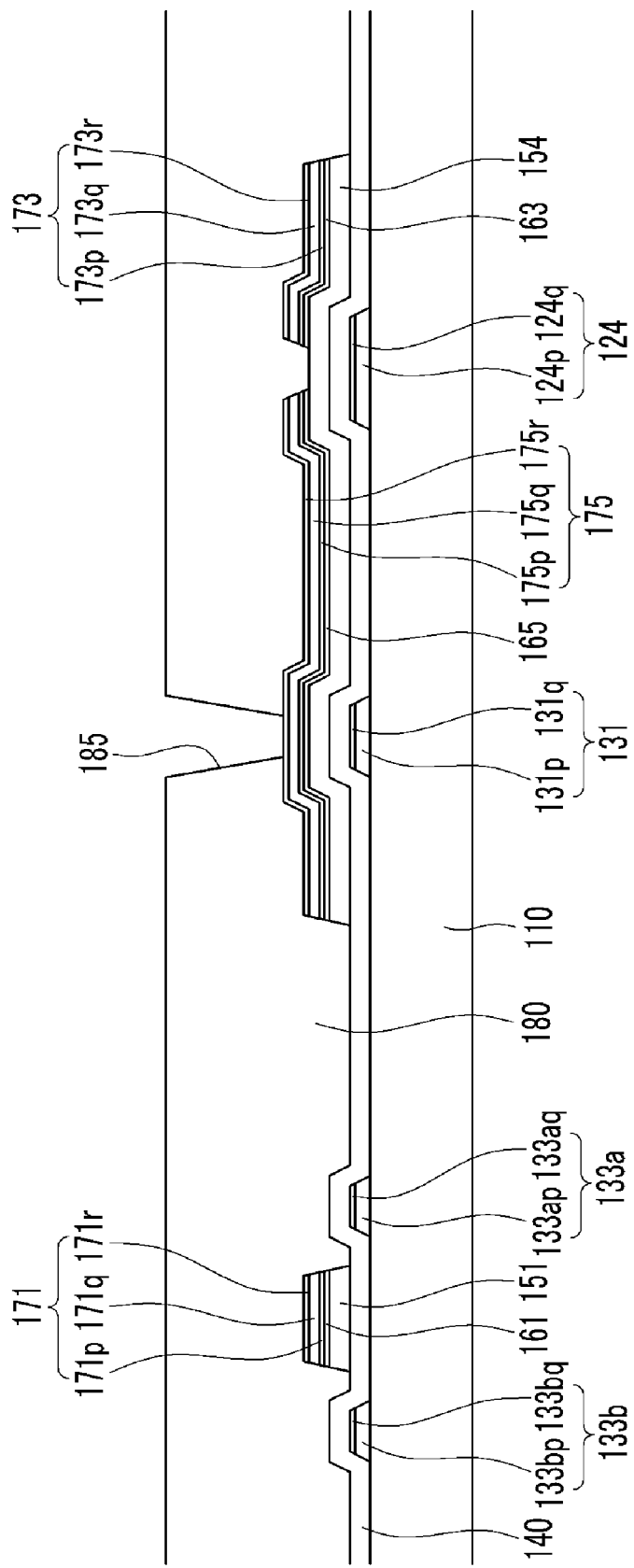
FIG. 26 and FIG. 27 are cross-sectional views of the exemplary TFT array panel shown in FIG. 25 taken along lines XXVI-XXVI and XXVII-XXVII, respectively.
Figure 27:
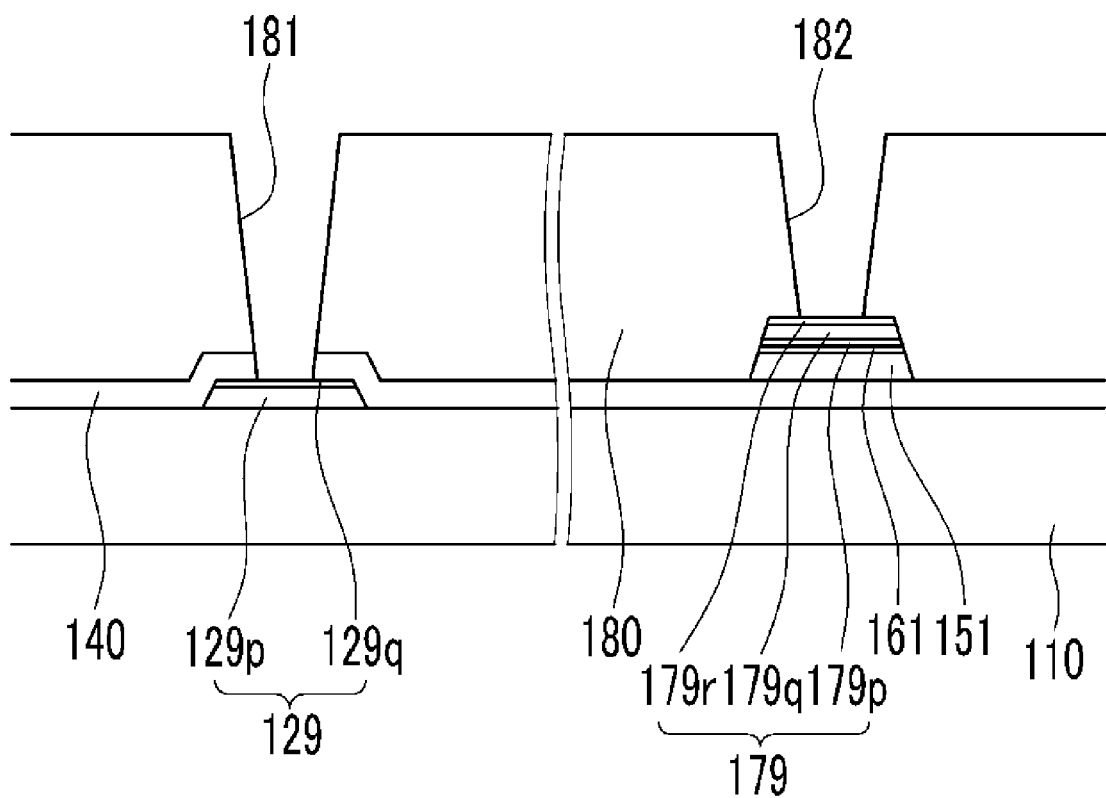

FIG. 19, FIG. 22, and FIG. 25 are layout views of the exemplary TFT array panel in intermediate steps of an exemplary manufacturing method thereof according to another exemplary embodiment of the present invention, FIG. 20 and FIG. 21 are cross-sectional views of the exemplary TFT array panel shown in FIG. 19 taken along lines XX-XX and XXI-XXI, respectively, FIG. 23 and FIG. 24 are cross-sectional views of the exemplary TFT array panel shown in FIG. 22 taken along lines XXIII-XXIII and XXIV-XXIV, respectively, and FIG. 26 and FIG. 27 are cross-sectional views of the exemplary TFT array panel shown in FIG. 25 taken along lines XXVI-XXVI and XXVII-XXVII, respectively.

Referring to FIG. 19 to FIG. 21, a metal film including an Al-containing metal is deposited on an insulating substrate 110 by sputtering when using a target containing aluminum (Al) and an atmosphere gas of argon (Ar) gas, and thereafter an oxide layer of an Al-containing metal is deposited on the metal film by sputtering in the same sputtering chamber and using the same target, and an atmosphere gas of oxygen ($O_2$) gas as well as argon (Ar) gas. Then the oxide layer and the metal film are patterned, such as by photolithography and etching, to form a plurality of gate lines 121 including gate electrodes 124 and end portions 129 and a plurality of storage electrode lines 131 including storage electrodes 133a and 133b. Here, the argon gas and the oxygen gas are in a ratio of about 1:1 to about 10:1, and the target containing aluminum may be an aluminum alloy including aluminum and nickel (Ni). In addition, the target may further include at least one of copper (Cu), boron (B), cerium (Ce), and lanthanum (La). The thickness of the upper film 121q and 131q of the gate line 121 and the storage electrode line 131, respectively, may be about 5% to about 50% of that of the lower film 121p and 131p, and more particularly may be about 10% of that of the lower film 121p and 131p of the gate line 121 and the storage electrode line 131, respectively.

Next, a gate insulating layer 140, an intrinsic a-Si layer, and an extrinsic a-Si layer are sequentially deposited by CVD, etc. as shown in FIG. 22 to FIG. 24.

Next, a lower metal film including a refractory metal such as molybdenum (Mo), chromium (Cr), tantalum (Ta), and titanium (Ti) is deposited, an upper metal film including an Al-containing metal is deposited by sputtering when using a target containing aluminum (Al) and an atmosphere gas of argon (Ar) gas, and an oxide layer of an Al-containing metal is deposited on the metal film by sputtering in the same sputtering chamber and using the same target, and an atmosphere gas of oxygen ($O_2$) gas as well as argon (Ar) gas. Here, the argon gas and the oxygen gas are in a ratio of about 1:1 to about 10:1, and the target containing aluminum (Al) may be an aluminum alloy including aluminum and nickel (Ni). In addition, the target may further include at least one of copper (Cu), boron (B), cerium (Ce), and lanthanum (La). Here, the thickness of the upper film 171r and 175r of the data line 171 and the drain electrode 175 may be about 5% to about 50% of that of the intermediate film 171q and 175q of the data line 171 and the drain electrode 175, respectively, and more particularly may be about 10% of that of the intermediate film 171q and 175q.

Next, the oxide layer, the upper metal film, the lower metal film, the extrinsic a-Si layer, and the intrinsic a-Si layer are patterned, such as by one photolithography step and by several etching steps, to form a plurality of data lines 171 including source electrodes 173 and end portions 179, a plurality of drain electrodes 175, a plurality of ohmic contacts 161 and 165, and a plurality of semiconductor stripes 151 including projections 154.

Here, a photoresist (not shown) used in the photolithography step has a position-dependent thickness. The photosensitive film pattern has first portions and second portions in the order of decreasing thickness. The first portions are located on wire areas that are occupied by the data lines 171 and the drain electrodes 175, while the second portions are located on channel areas of TFTs.

The position-dependent thickness of the photosensitive film pattern is obtained by several techniques, for example by providing translucent areas on a photo-mask as well as light transmitting transparent areas and light blocking opaque areas. The translucent areas may be provided with a slit pattern, a lattice pattern, or a thin film(s) with intermediate transmittance or intermediate thickness. When using a slit pattern, it is preferable that the width of the slits or the distance between the slits is smaller than the resolution of a light exposer used for the photolithography. Another example is to use a reflowable photosensitive film. In detail, once a photoresist made of a reflowable material is formed by using a normal photo-mask with only transparent areas and opaque areas, it is subjected to a reflow process to flow onto areas without the photoresist, thereby forming thin portions.

In more detail, exposed portions of the data metal layer, which are not covered with the photosensitive film pattern, and underlying portions of the extrinsic a-Si layer, and the intrinsic a-Si layer thereunder, are removed by dry etching. Next, the second portions of the photosensitive film pattern on the channel areas of the TFTs are removed. At this time, the first portions of the photosensitive film pattern become thin. Then, exposed portions of the data metal pattern on the channel areas of the TFTs are removed to separate the conductive layer into the data lines 171 and the drain electrodes 175 and to expose underlying portions of the extrinsic a-Si layer on the channel areas of the TFTs. The exposed portions of the extrinsic a-Si layer are removed to form the ohmic contacts 161 and 165 and to expose portions of the intrinsic semiconductor stripes 151.

Next, a passivation layer 180 is deposited, and sequentially the passivation layer 180 and the gate insulating layer 140 are patterned by photolithography and etching to form a plurality of contact holes 181, 182, 183, 184, and 185 as shown in FIG. 25 to FIG. 27.

Finally, a transparent conducting layer of such ITO or IZO is deposited on the passivation layer 180 by sputtering, etc., and is patterned to form a plurality of pixel electrodes 191, a plurality of contact assistants 81 and 82, and a plurality of overpasses 83 as shown in FIG. 16 to FIG. 19.

Figure 29A:
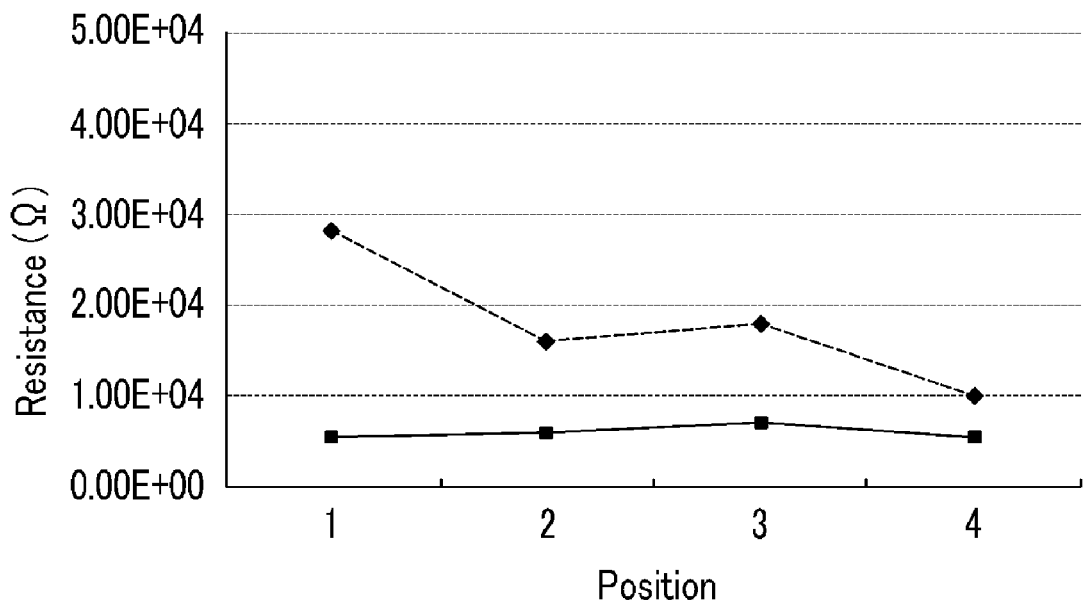
FIG. 29A and FIG. 29B are graphs showing contact resistance between an aluminum signal line and an upper layer in an experimental example of the present invention.
Figure 29B:
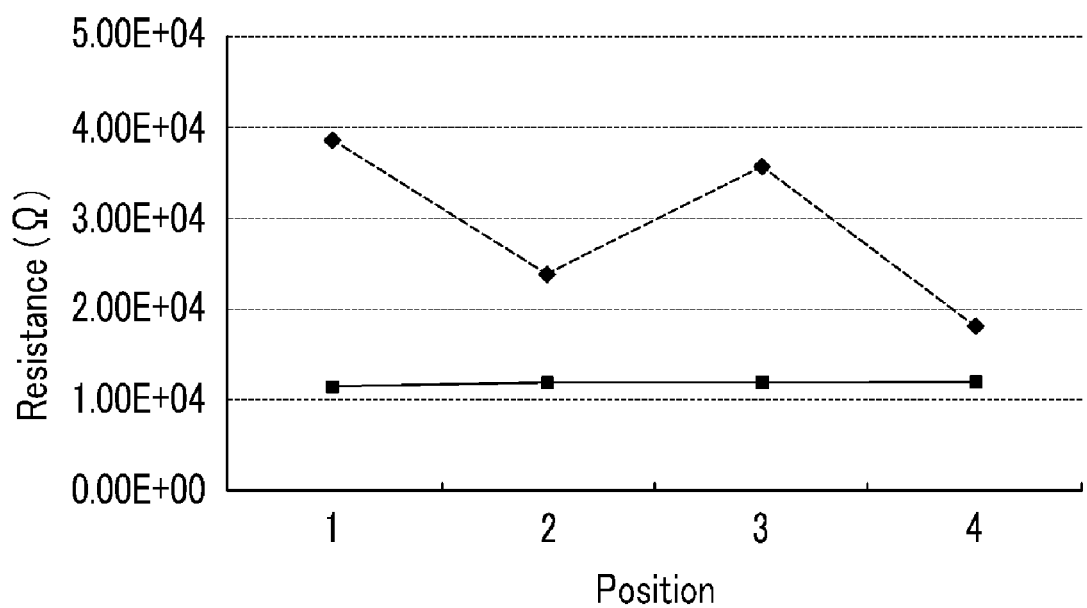
Figure 30A:
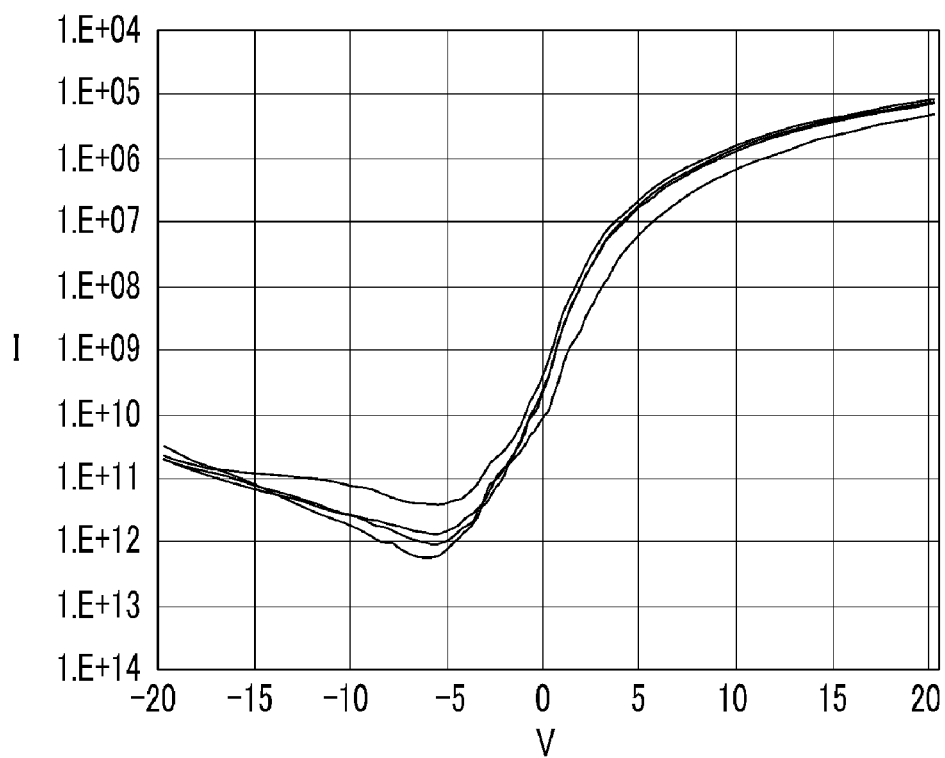
FIG. 30A and FIG. 30B are graphs showing performance variation of the TFT according to an experimental example of the present invention.
Figure 30B:
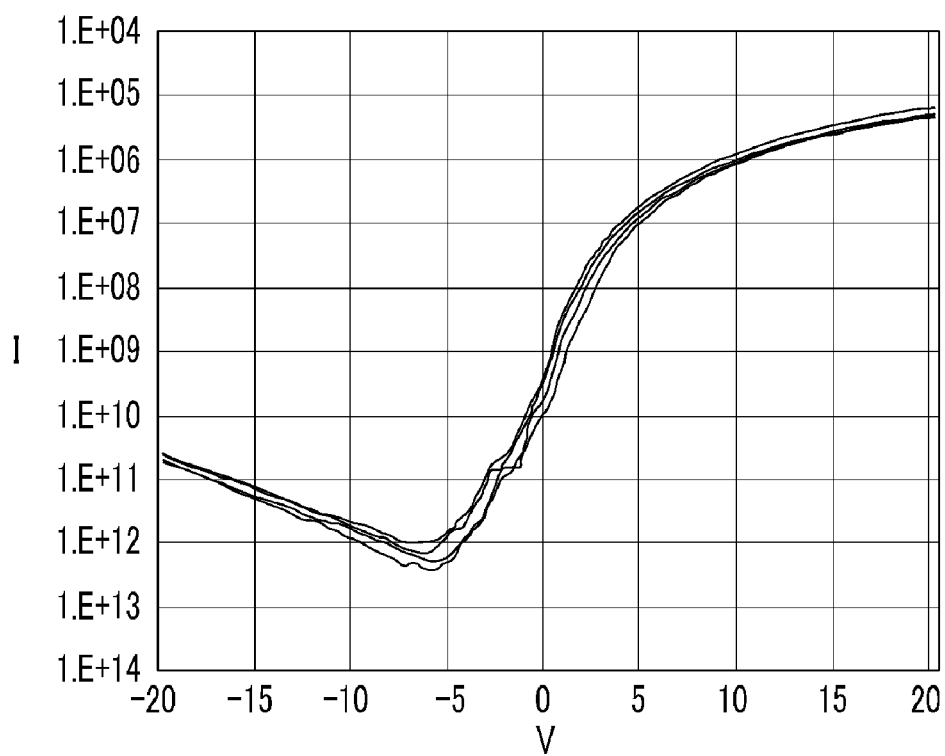
Figure 31A:
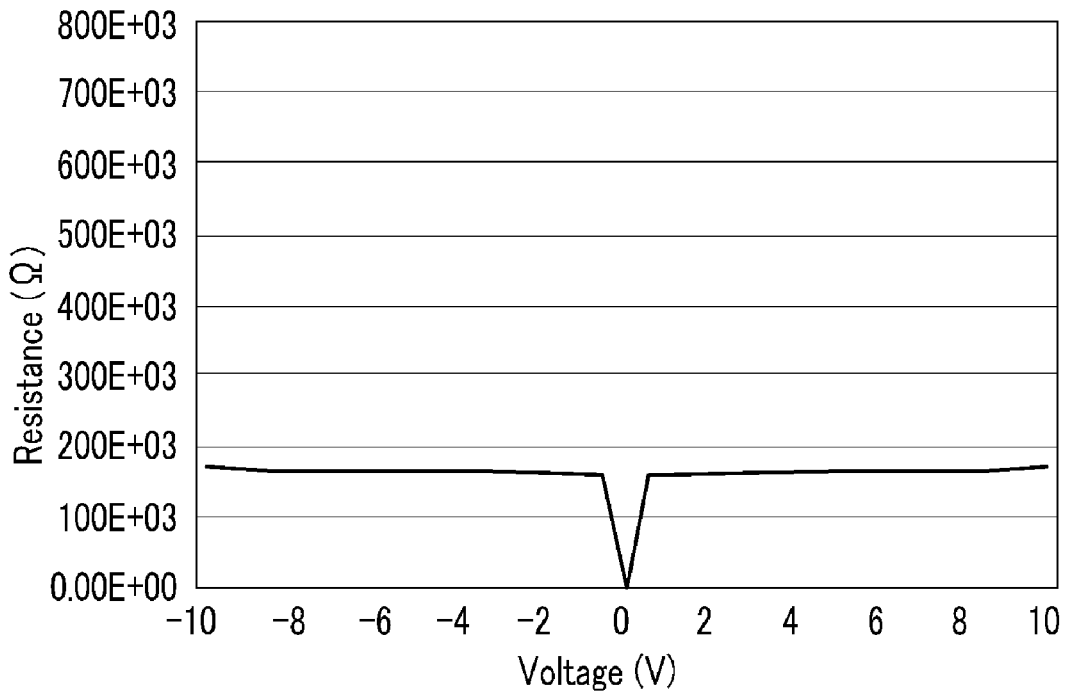
FIG. 31A and FIG. 31B are graphs showing contact resistance variation of signal lines in an experimental example of the present invention.
Figure 31B:
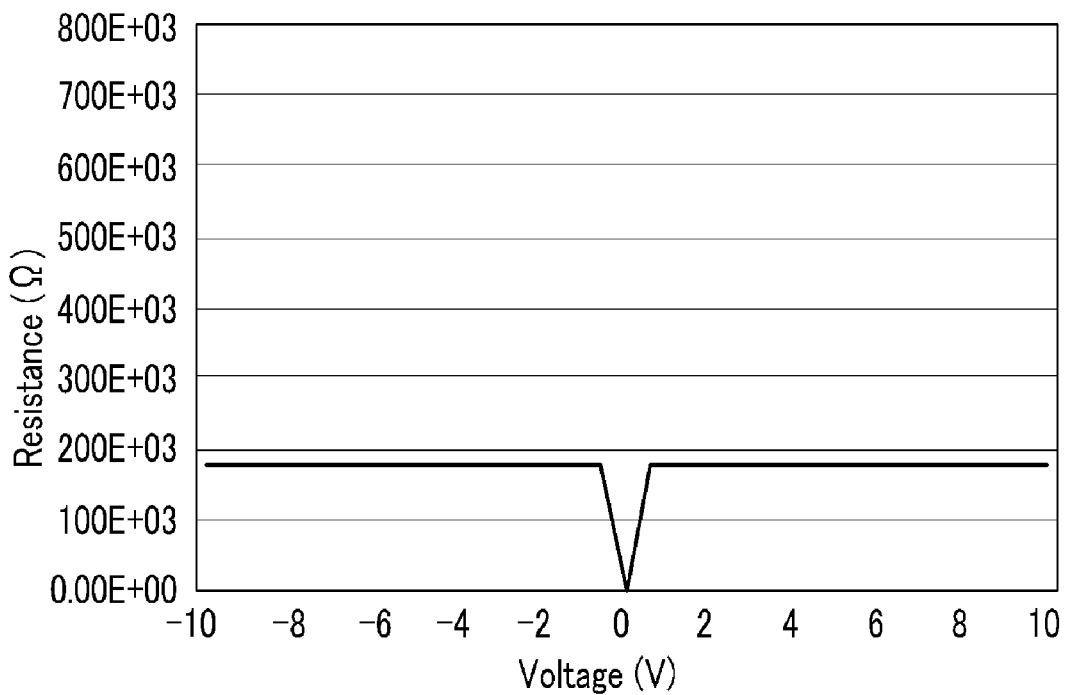

Now, a performance characteristic variation of an exemplary signal line of a TFT according to an experimental example according to the present invention will be described with reference to FIG. 28 to FIG. 31B. FIG. 28 is a table showing contact resistance between an exemplary aluminum (Al) signal line and an exemplary upper layer in an experimental example of the present invention, and FIG. 29A and FIG. 29B are graphs showing contact resistance between an exemplary aluminum (Al) signal line and an exemplary upper layer in an experimental example of the present invention. FIG. 30A and FIG. 30B are graphs showing performance variation of the exemplary TFT according to an experimental example of the present invention, and FIG. 31A and FIG. 31B are graphs showing contact resistance variation of exemplary signal lines in an experimental example of the present invention.

In the experimental example, for measuring the effects of the upper film of an aluminum oxide layer on the signal line of an aluminum alloy, a TFT array panel having a gate line and a data line including a lower signal line including an Al-containing metal and an upper signal line disposed on the lower signal line and made of a metal other than aluminum (Al) was formed 8 times on different substrates, respectively (case A), and a TFT array panel having a gate line and a data line including a lower signal line including an Al-containing metal and an upper signal line disposed on the lower signal line and made of the aluminum oxide layer according to the embodiment of the present invention was formed 8 times on different substrates, respectively (case B). Then, for each of case A and case B, desired values were measured in 16 positions of each the substrates, which were the same at each substrate, an average value of the measured desired values in each of two positions was calculated, and a total average value of the measured desired values in every position was calculated, and then the results for case A and case B were compared. Here, other conditions were the same except for the upper signal line.

Firstly, contact resistance between the signal line including the Al-containing metal and the upper layer disposed on the lower signal line in the experimental example will be described with reference to FIG. 28 and FIG. 29A and FIG. 29B.

FIG. 28 shows contact resistance (Rcdi) between the data line and a transparent conductor layer of IZO and contact resistance (Rcgi) between the gate line and a transparent conductor layer of IZO for each of case A and case B.

As shown in FIG. 28, contact resistance (Rcdi) and contact resistance (Rcgi) are smaller in case B according to the exemplary embodiment of the present invention than in case A. Particularly, the difference of contact resistance (Rcdi) between the data line and a transparent conductor layer of IZO of case A and case B is smaller by one order, so it is known that contact resistance (Rcdi) between the data line and a transparent conductor layer of IZO in the embodiment of the present invention was significantly decreased.

As described above, in the exemplary TFT according to an exemplary embodiment of the present invention, the lower signal line made of an Al-containing metal and the upper signal line made of an aluminum oxide layer are formed such that the lower signal line and the upper signal line may be formed in the same chamber and by using the same metal target, and so the signal line of aluminum (Al) having an excellent contact characteristic to a transparent conductor layer of IZO may be formed even though the manufacturing process of the signal line may not be complicated.

The contact resistance (Rcdi) between the data line and a transparent conductor layer of IZO for the cases A and B is shown in FIG. 29A, and contact resistance (Rcgi) between the gate line and a transparent conductor layer of IZO for the cases A and B is shown in FIG. 29B. In the graphs, case A is shown by a dotted line and case B is shown by a solid line.

As shown in FIG. 29A and FIG. 29B, contact resistance (Rcdi) and contact resistance (Rcgi) are smaller in case B according to the exemplary embodiment of the present invention than in case A. In addition, although contact resistance (Rcdi) of case A shown by the dotted line is varied according to measuring positions, contact resistance (Rcdi) of case B according to the exemplary embodiment of the present invention is almost constant irrespective of measuring positions.

Accordingly, according to an exemplary embodiment of the present invention, the signal line of aluminum (Al) having a stable contact characteristic irrespective of measuring positions to a transparent conductor layer of IZO may be formed even though the manufacturing process of the signal line may not be complicated.

Next, a performance characteristic variation of an exemplary TFT according to an experimental example according to the present invention will be described referring to FIG. 30A and FIG. 30B. The current-voltage curves (I-V curves) of the TFTs for case A is shown in FIG. 30A, and current-voltage curves (I-V curves) of the TFTs for case B is shown in FIG. 30B.

Referring to FIG. 30A and FIG. 30B, the current characteristics of the TFTs according to cases A and B were almost equal, and the current characteristics satisfy desirable current characteristics of a TFT for an LCD. Accordingly, according to an exemplary embodiment of the present invention, the signal line of aluminum (Al) having an excellent contact characteristic to a transparent conductor layer of IZO may be formed even though the current characteristics of the TFTs may not be deteriorated.

Next, contact resistance of the signal line according to voltage of a TFT array panel according to an experimental example according to the present invention will be described referring to FIG. 31. The variation of contact resistance (Rcdi) between the data line and a transparent conductor layer of IZO according to voltage for case A is shown in FIG. 31A, and variation of contact resistance (Rcdi) between the data line and a transparent conductor layer of IZO according to voltage for case B is shown in FIG. 31B.

Referring to FIG. 31A and FIG. 31B, the contact resistance (Rcdi) is almost constant irrespective of voltage in each of the cases A and B. In addition, the contact resistance is more constant irrespective of voltage in case B according to an embodiment of the present invention, Accordingly, according to an exemplary embodiment of the present invention, the signal line of aluminum (Al) having an excellent contact characteristic to a transparent conductor layer of IZO may be formed irrespective of voltage applied to the signal line.

Figure 32:
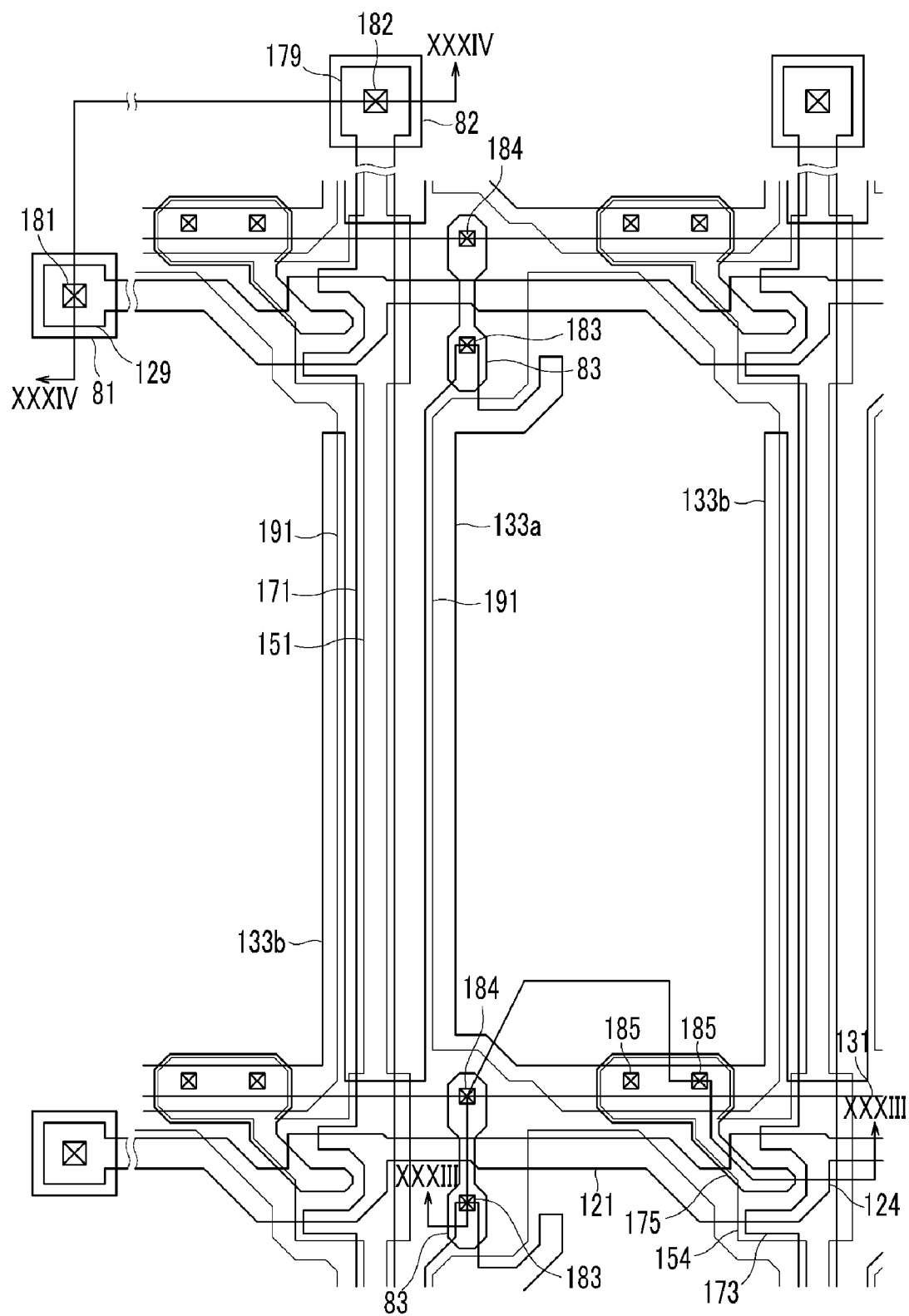
FIG. 32 is a layout view of an exemplary TFT array panel according to another exemplary embodiment of the present invention.

Now, an exemplary TFT array panel according to another exemplary embodiment of the present invention will be described in detail with reference to FIG. 32 to FIG. 34. FIG. 32 is a layout view of an exemplary TFT array panel according to another exemplary embodiment of the present invention, and FIG. 33 and FIG. 34 are cross-sectional views of the exemplary TFT array panel shown in FIG. 32 taken along lines XXXIII-XXXIII and XXXIV-XXXIV, respectively.

Figure 33:
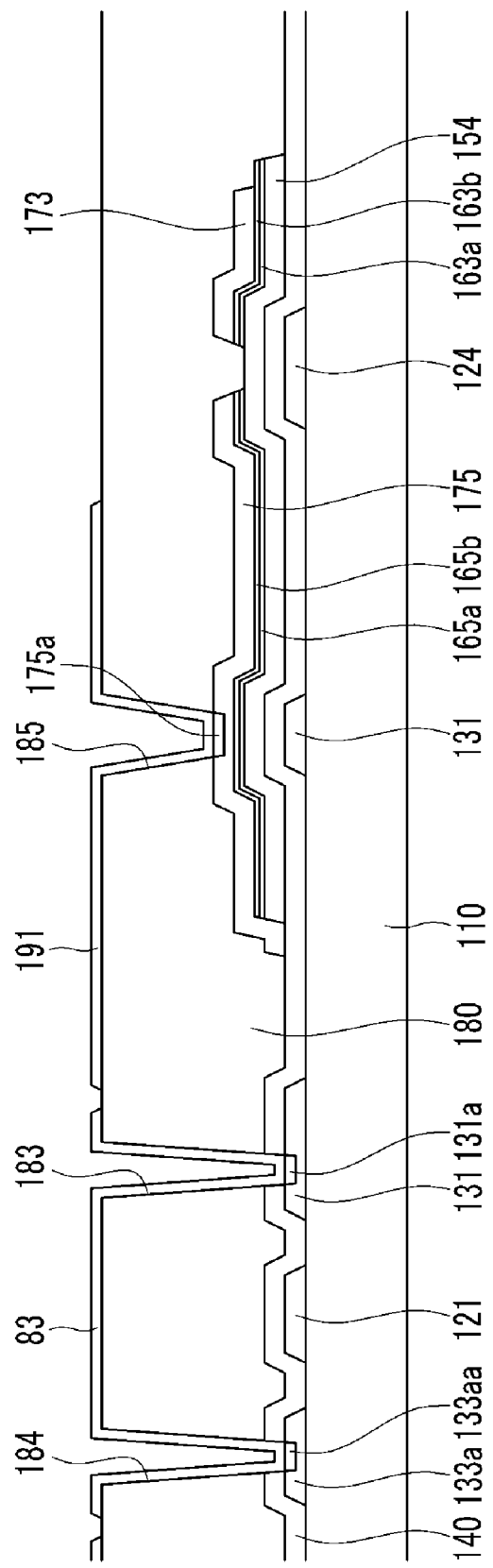
FIG. 33 and FIG. 34 are cross-sectional views of the exemplary TFT array panel shown in FIG. 32 taken along lines XXXIII-XXXIIII and XXXIV-XXXIV, respectively.
Figure 34:
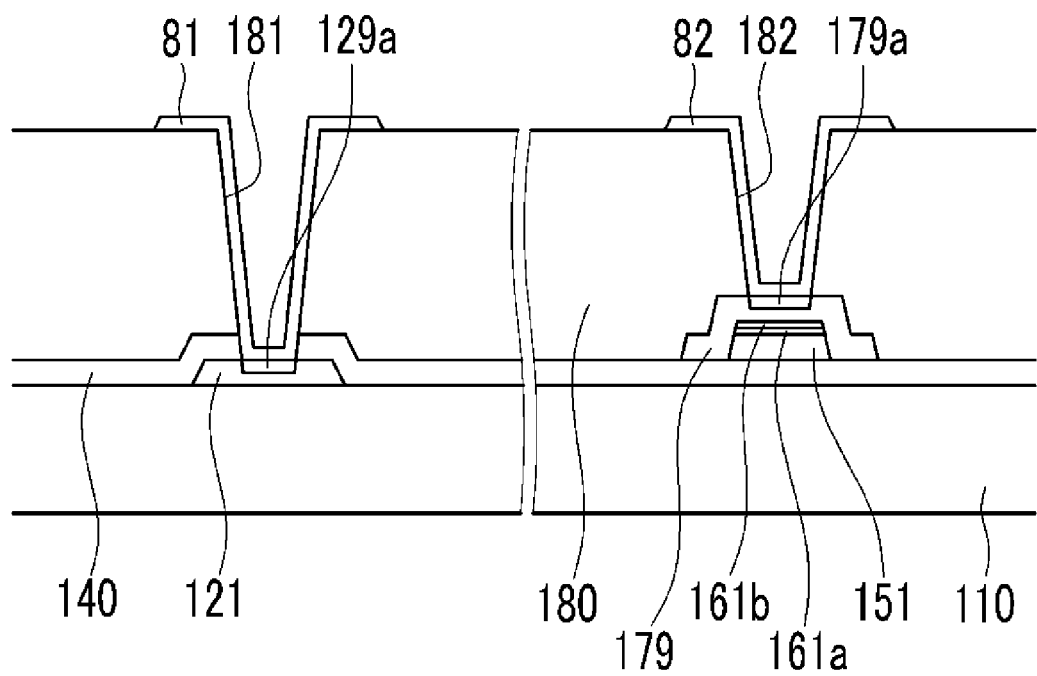

As shown in FIG. 32 to FIG. 34, a layered structure of a TFT array panel according to the present embodiment is substantially similar as that shown in FIG. 1 to FIG. 3.

A plurality of gate lines 121 including a plurality of gate electrodes 124 and a plurality of end portions 129, and a plurality of storage electrode lines 131 including a plurality of storage electrodes 133a and 133b, are disposed on a substrate 110. A gate insulating layer 140, a plurality of semiconductor stripes 151 including projections 154, a plurality of ohmic contact stripes 161a including projections 163a and a plurality of ohmic contact islands 165a, and a plurality of blocking layers 161b, 163b, and 165b are sequentially disposed on the gate lines 121 and the storage electrode lines 131.

A plurality of data lines 171 including source electrodes 173 and end portions 179 and a plurality of drain electrodes 175 are disposed on the blocking layers 161b, 163b, and 165b and the gate insulating layer 140, and a passivation layer 180 is disposed thereon. The gate insulating layer 140 and the passivation layer 180 have a plurality of contact holes 181, 182, 183, 184, and 185, and a plurality of buffer members 129a, 179a, 131a, 133aa, and 175a are formed on the respective exposed signal lines through the contact holes 181, 182, 183, 184, 185. A plurality of pixel electrodes 191, a plurality of contact assistants 81 and 82, and a plurality of overpasses 83 are disposed on the passivation layer 180 and the plurality of buffer members 129a, 179a, 131a, 133aa, and 175a.

However, unlike the exemplary TFT array panel shown in FIG. 1 to FIG. 3, the gate line 121 and the storage electrode line 131 have a single-layered structure including aluminum (Al), and the data line 171 and the drain electrode 175 also have a single-layered structure including aluminum (Al).

The plurality of blocking layers 161b, 163b, and 165b are disposed between the ohmic contacts 161a, 163a, and 165a, and the data line 171 and drain electrode 175. The blocking layers 161b, 163b, and 165b may contribute to blocking the diffusion of Al atoms of the data line 171 and the drain electrode 175 into the semiconductors 151 and 154 or ohmic contacts 161a and 165a. The blocking layers 161b, 163b, and 165b may be made of a nitrogen compound. In an alternative exemplary embodiment, the blocking layers 161b, 163b, and 165b may be omitted.

In addition, the TFT array panel according to this exemplary embodiment of the present invention includes the buffer members 129a, 179a, 131a, 133aa, and 175a formed in the contact holes 181, 182, 183, 184, and 185. The buffer members 129a, 179a, 131a, 133aa, and 175a have substantially the same planar shape as the contact holes 181, 182, 183, 184, and 185, and the buffer members 129a, 179a, 131a, 133aa, 175a fully cover the exposed portions of the end portions 129 and 179, the storage electrode lines 131, and the drain electrodes 175, which are exposed through the contact holes 181, 182, 183, 184, and 185.

The buffer members 129a, 179a, 131a, 133aa, and 175a may be made of an oxide layer including aluminum (Al), and they are made by subjecting the upper surface of the signal lines including aluminum (Al) to oxygen $O_2$ plasma.

The buffer members 129a, 179a, 131a, 133aa, and 175a may improve the contact characteristic and enhance the adhesion between the pixel electrodes 191, the contact assistants 81 and 82, and the overpasses 83 including ITO or IZO and the exposed portion of the gate lines 121 and the data lines 171 through the contact holes 181, 182, 183, 184, and 185. Accordingly, the contact assistants 81 and 82, the overpass 83, and the pixel electrode 191 made of ITO or IZO may be prevented from tacking off from the signal lines made of an aluminum containing metal.

Many characteristics of the exemplary TFT array panel shown in FIG. 1 to FIG. 3 can be applied to the exemplary TFT array panel shown in FIG. 32 to FIG. 34.

Now, an exemplary manufacturing method of the exemplary TFT array panel shown in FIG. 32 to FIG. 34 according to the another exemplary embodiment of the present invention will be described in detail with reference to FIG. 35 to FIG. 47E along with FIG. 32 to FIG. 34.

Figure 35:
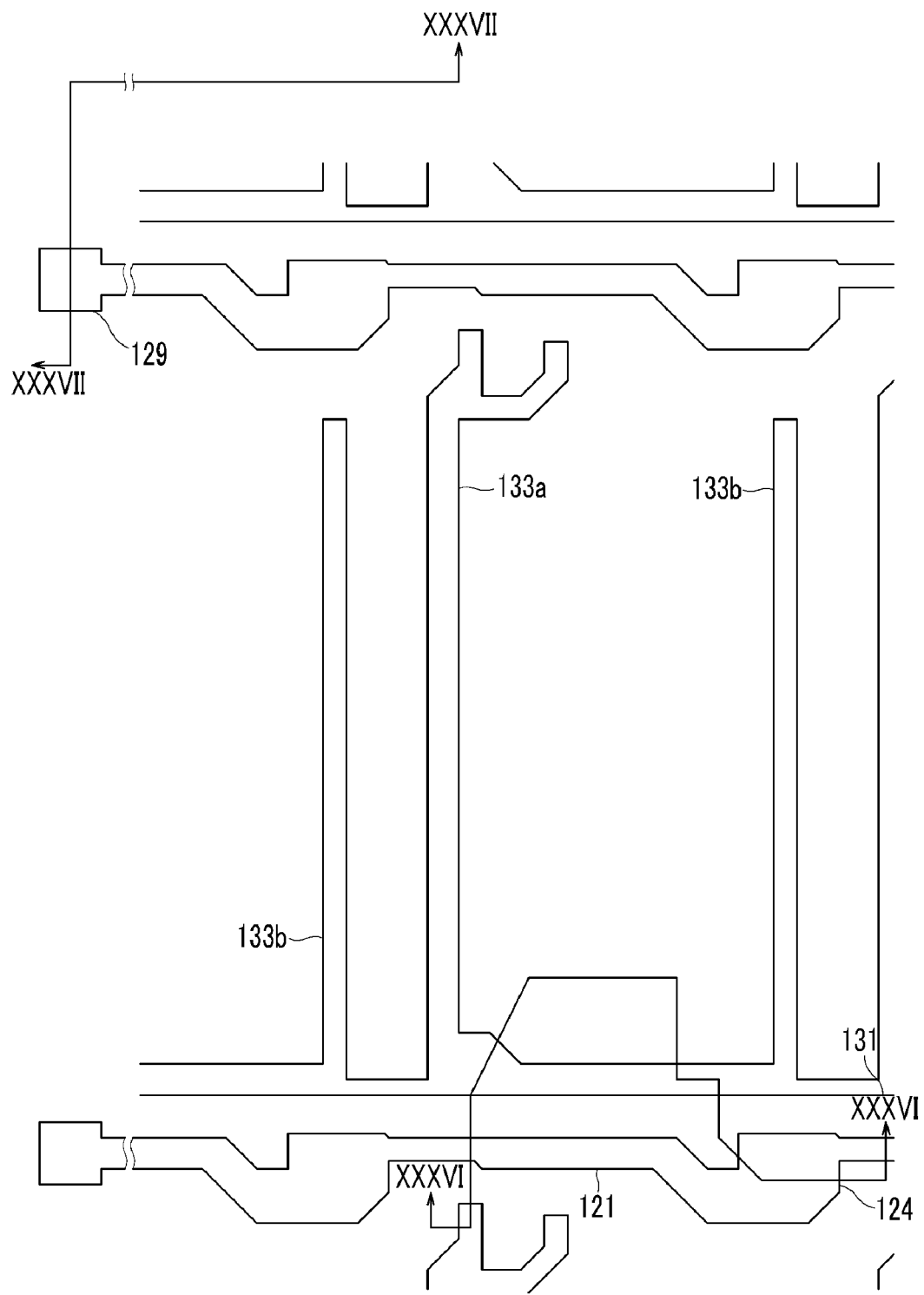
FIG. 35, FIG. 38, FIG. 41, and FIG. 44 are layout views of the exemplary TFT array panel in intermediate steps of an exemplary manufacturing method thereof according to another exemplary embodiment of the present invention.
Figure 36:
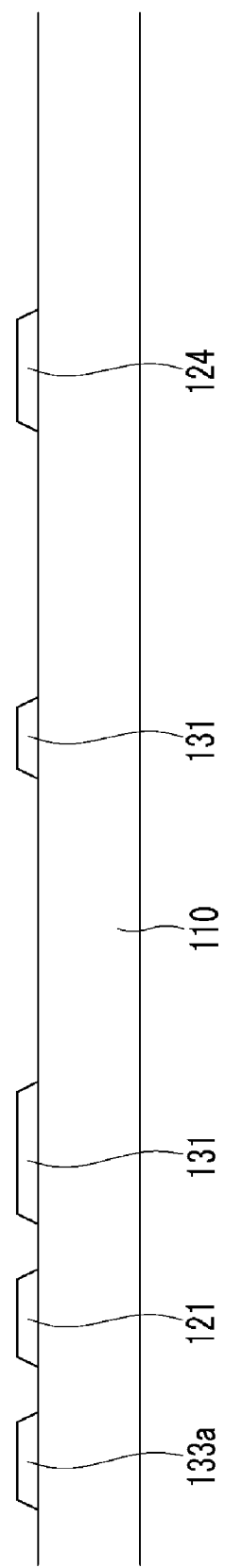
FIG. 36 and FIG. 37 are cross-sectional views of the exemplary TFT array panel shown in FIG. 35 taken along lines XXXVI-XXXVI and XXXVII-XXXVII, respectively.
Figure 37:
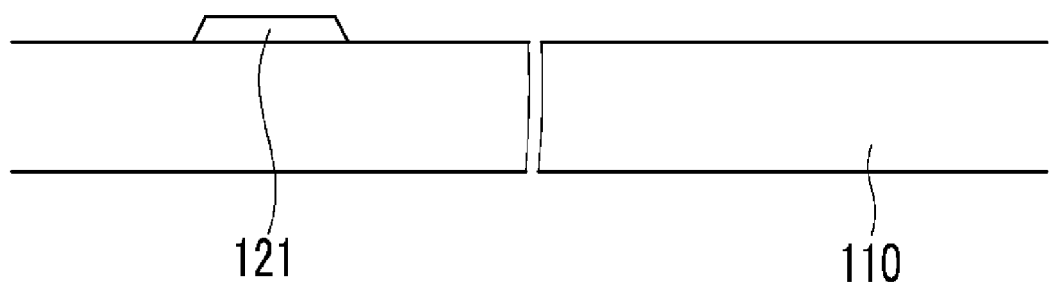
Figure 38:
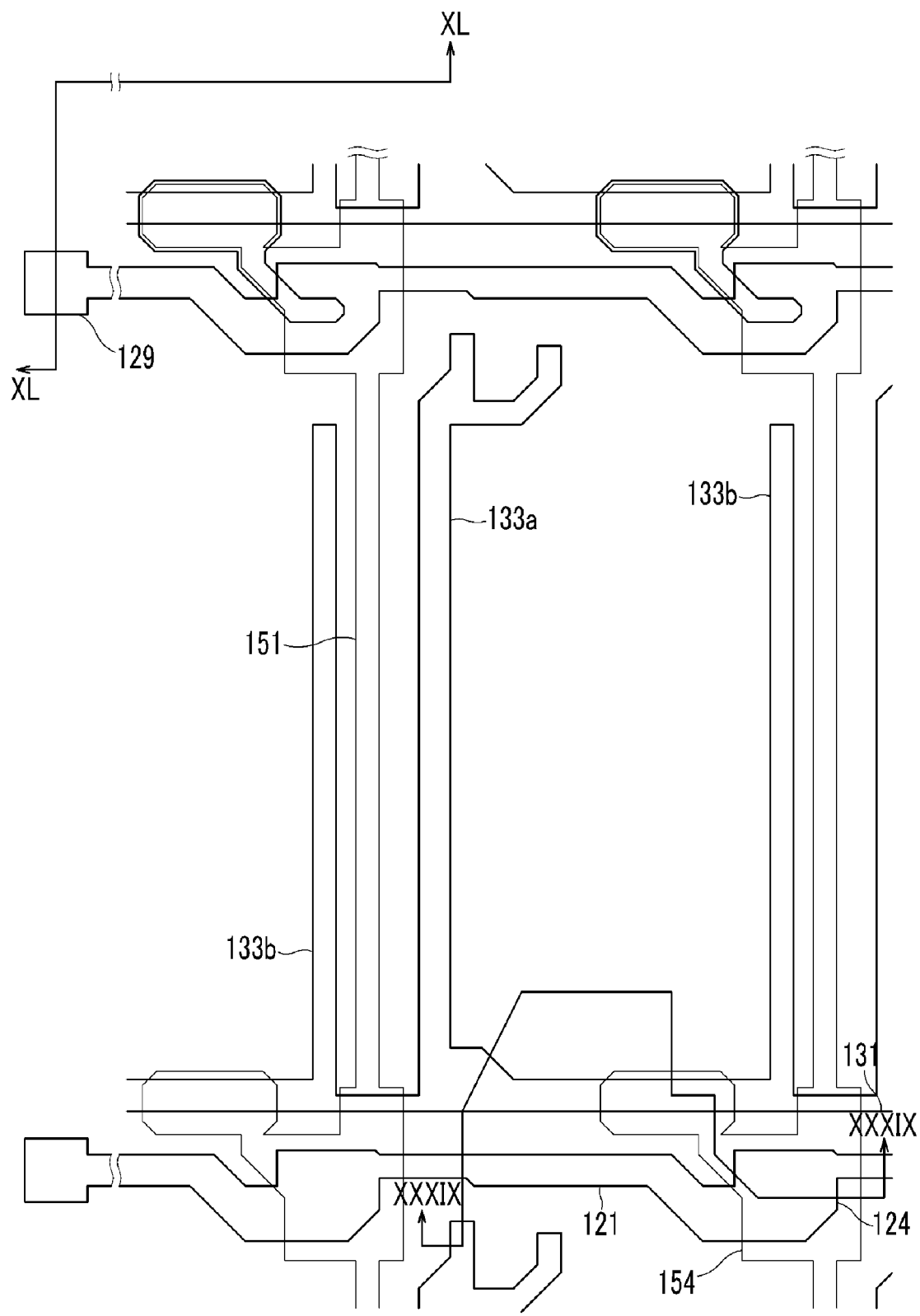
Figure 39:
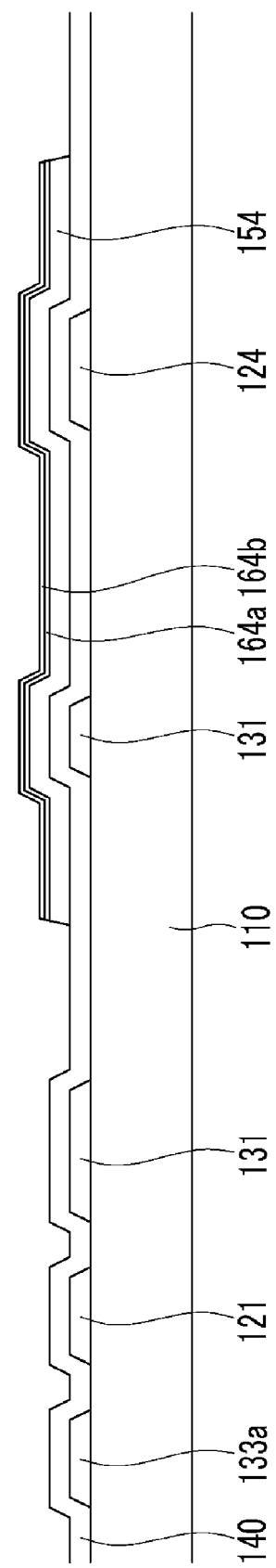
FIG. 39 and FIG. 40 are cross-sectional views of the exemplary TFT array panel shown in FIG. 38 taken along lines XXXIX-XXXIX and XL-XL, respectively.
Figure 40:
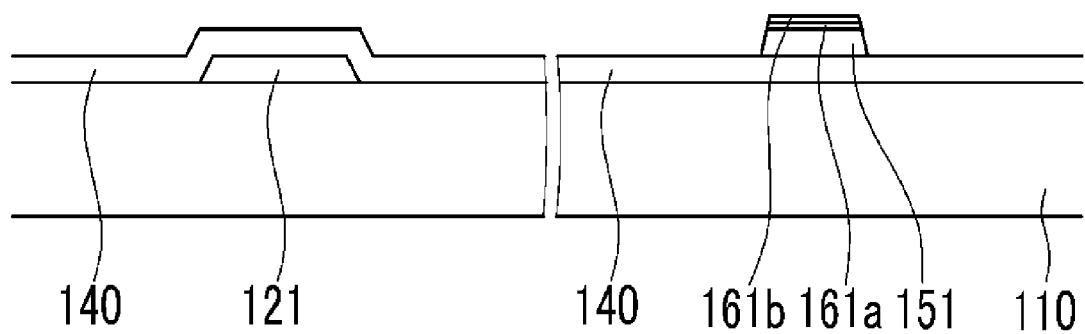
Figure 41:
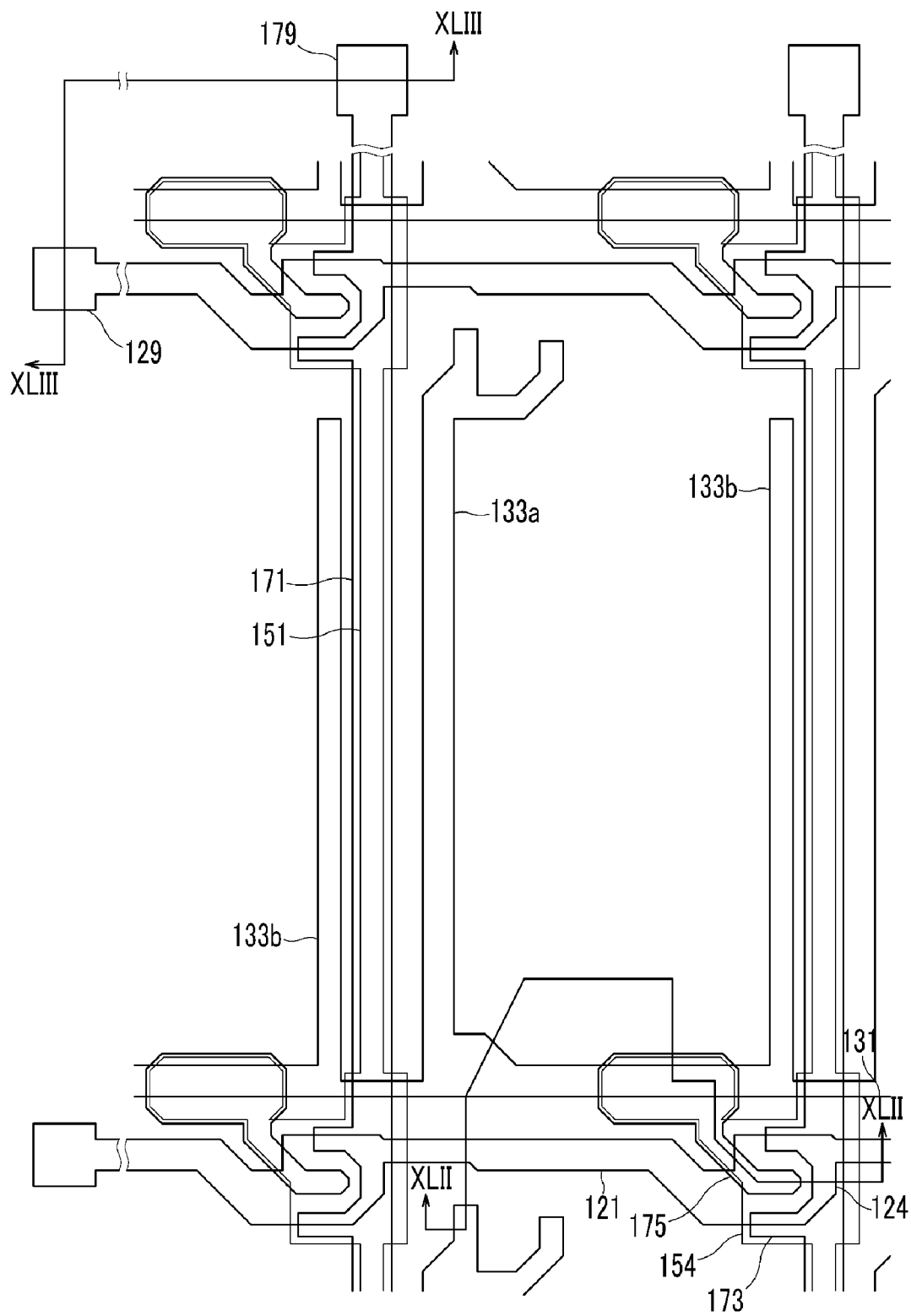
Figure 42:
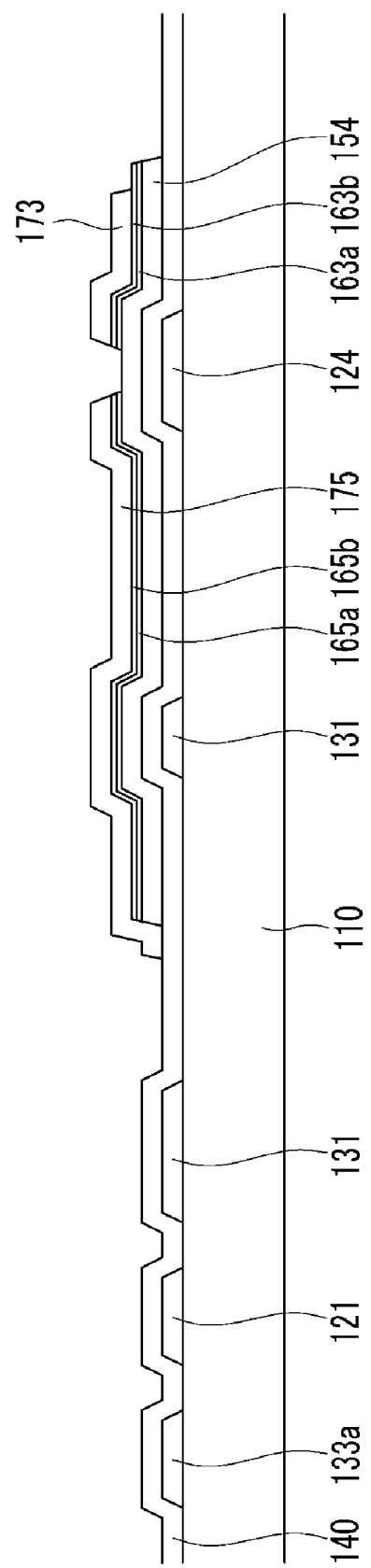
FIG. 42 and FIG. 43 are cross-sectional views of the exemplary TFT array panel shown in FIG. 41 taken along lines XLII-XLII and XLIII-XLIII, respectively.
Figure 43:
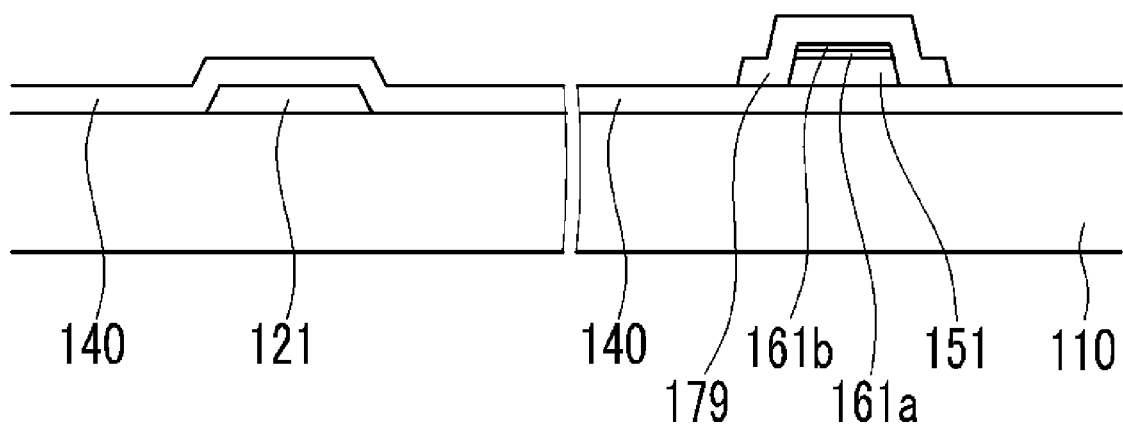
Figure 44:
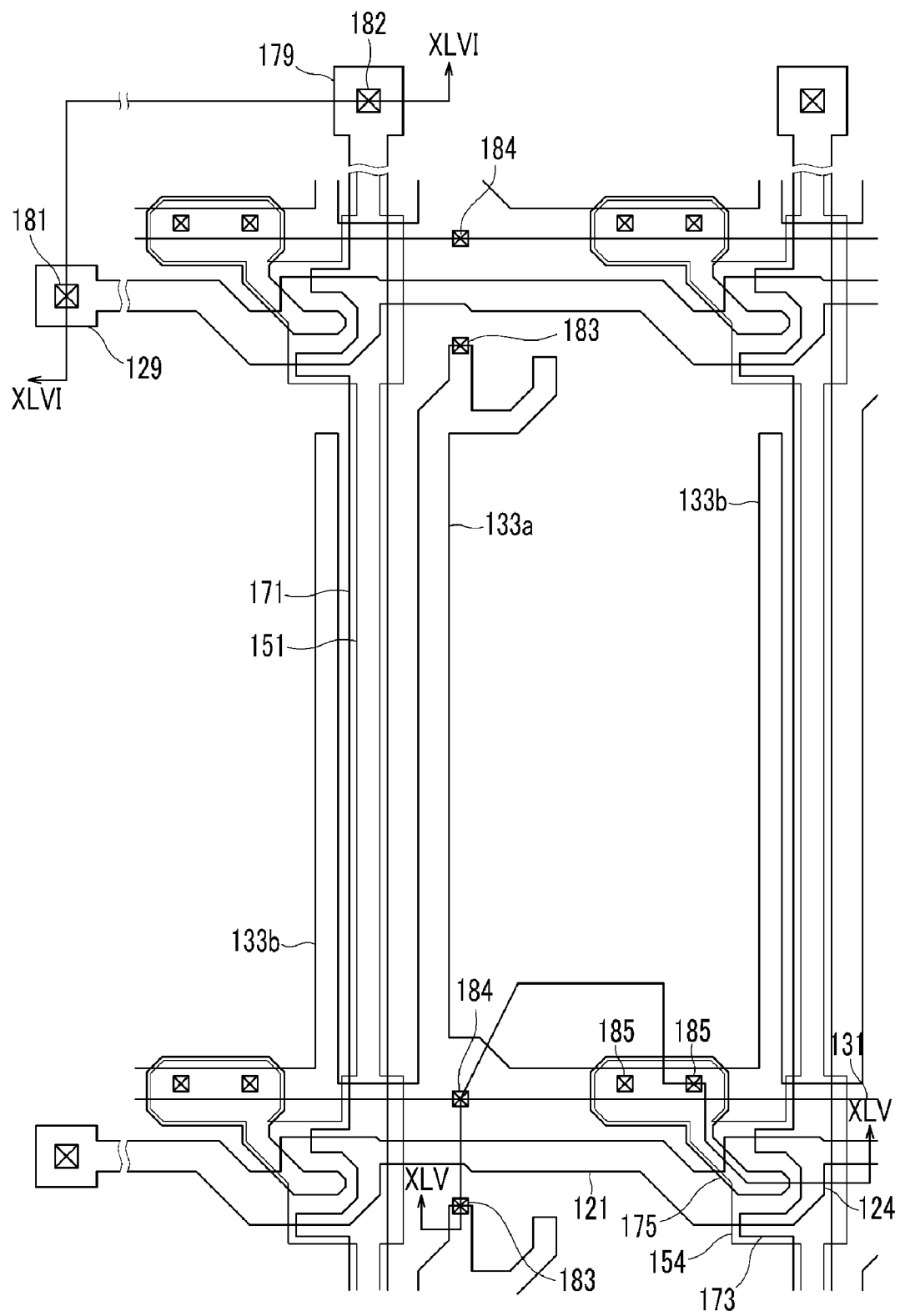
Figure 45:
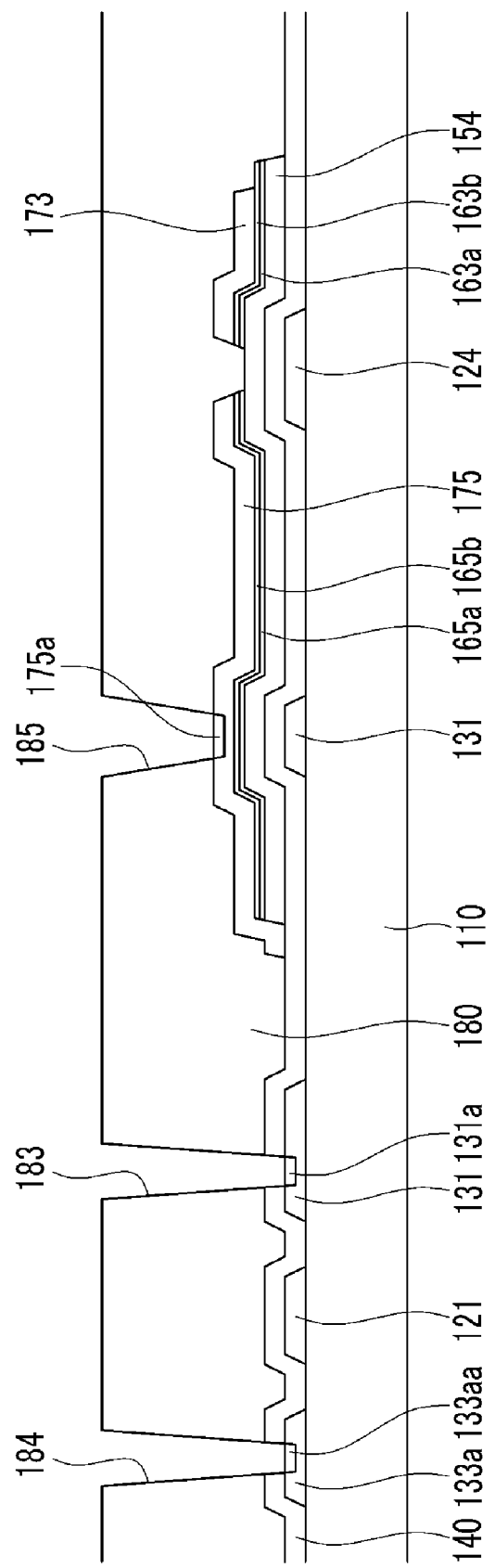
FIG. 45 and FIG. 46 are cross-sectional views of the exemplary TFT array panel shown in FIG. 44 taken along lines XLV-XLV and XLVI-XLVI, respectively.
Figure 46:
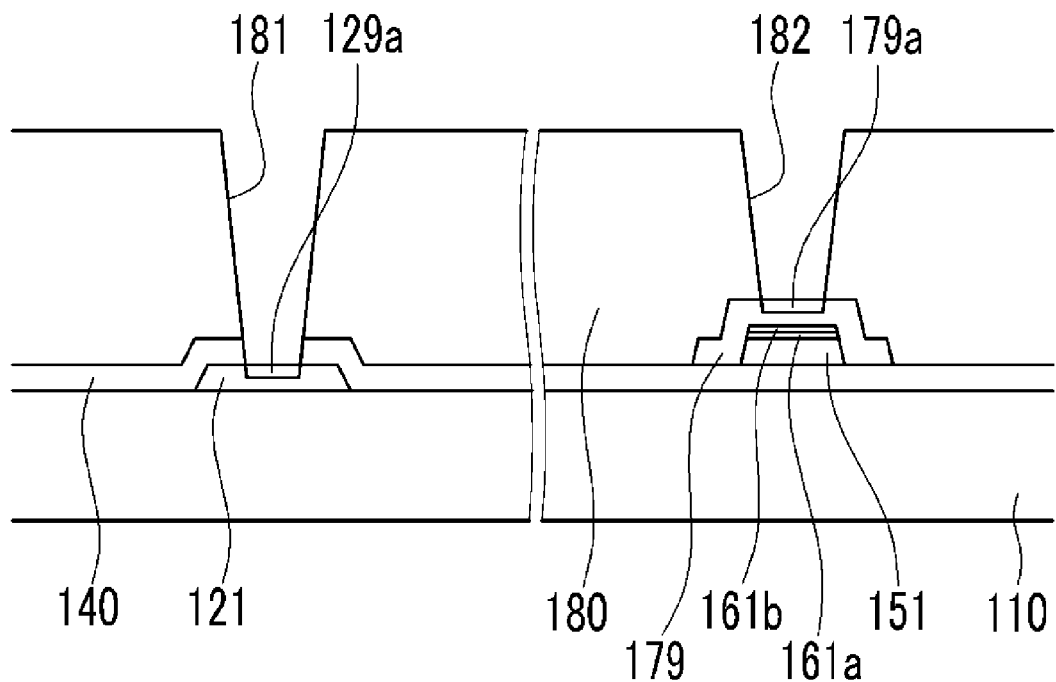

FIG. 35, FIG. 38, FIG. 41, and FIG. 44 are layout views of the exemplary TFT array panel in intermediate steps of an exemplary manufacturing method thereof according to another exemplary embodiment of the present invention, FIG. 36 and FIG. 37 are cross-sectional views of the exemplary TFT array panel shown in FIG. 35 taken along lines XXXVI-XXXVI and XXXVII-XXXVII, respectively, FIG. 39 and FIG. 40 are cross-sectional views of the exemplary TFT array panel shown in FIG. 38 taken along lines XXXIX-XXXIX and XL-XL, respectively, FIG. 42 and FIG. 43 are cross-sectional views of the exemplary TFT array panel shown in FIG. 41 taken along lines XLII-XLII and XLIII-XLIII, respectively, FIG. 45 and FIG. 46 XLII-XLII are cross-sectional views of the exemplary TFT array panel shown in FIG. 44 taken along lines XLV-XLV and XLVI-XLVI, respectively, and FIG. 47A to FIG. 47E are sectional views sequentially showing an exemplary manufacturing method of the exemplary TFT array panel shown in FIG. 44 to FIG. 46.

Referring to FIG. 35 to FIG. 37, a metal film including an Al-containing metal is deposited on an insulating substrate 110 by sputtering, etc., and then the metal film is patterned, such as by photolithography and etching, to form a plurality of gate lines 121 including gate electrodes 124 and end portions 129 and a plurality of storage electrode lines 131 including storage electrodes 133a and 133b.

As shown in FIG. 38 to FIG. 40, a gate insulating layer 140 is deposited, and then a plurality of intrinsic semiconductor stripes 151 including projections 154, a plurality of extrinsic semiconductor stripes 161a and 164a, and a plurality of blocking layer stripes 161b and 164b are formed.

In detail, the gate insulating layer 140, an intrinsic a-Si layer, an extrinsic a-Si layer, and a nitrogen compound layer are sequentially deposited by CVD, etc., and then they are patterned, such as by photolithography and etching, to form the semiconductor stripes 151 including projections 154, the extrinsic semiconductor stripes 161a and 164a, and the blocking layer stripes 161b and 164b. In particularly, the nitrogen compound layer may be deposited by a plasma enhanced chemical vapor deposition ("PECVD") method.

Referring to FIG. 41 to FIG. 43, a metal film including an Al-containing metal is deposited by sputtering etc., and then the metal film is patterned, such as by photolithography and etching, to form a plurality of data lines 171 including source electrodes 173 and end portions 179 and a plurality of drain electrodes 175.

Thereafter, exposed portions of the extrinsic semiconductor stripes 164a and the blocking layer 164b, which are not covered with the data lines 171 and the drain electrodes 175, are removed to complete a plurality of ohmic contact stripes 161a including projections 163a and a plurality of ohmic contact islands 165a and a plurality of blocking layers 161b, 163b, and 165b, and to expose portions of the intrinsic semiconductor stripes 151.

As shown in FIG. 44 to FIG. 46, a passivation layer 180 is deposited, and sequentially the passivation layer 180 and the gate insulating layer 140 are patterned, such as by photolithography and etching, to form a plurality of contact holes 181, 182, 183, 184, and 185. Subsequently, a plurality of buffer members 129a, 179a, 131a, 133aa, and 175a are formed in the contact holes 181, 182, 183, 184, and 185.

Now, exemplary process steps of forming the contact holes 181, 182, 183a, 183b, and 185 and the buffer members 129a, 179a, 131a, 133aa, and 175a will be described in detail with reference to FIG. 47A to FIG. 47E. Although FIGS. 47A-47E show only the sectional views corresponding to FIG. 45, the following description can cover the other structures corresponding to FIG. 44 to FIG. 46.

Figure 47A:
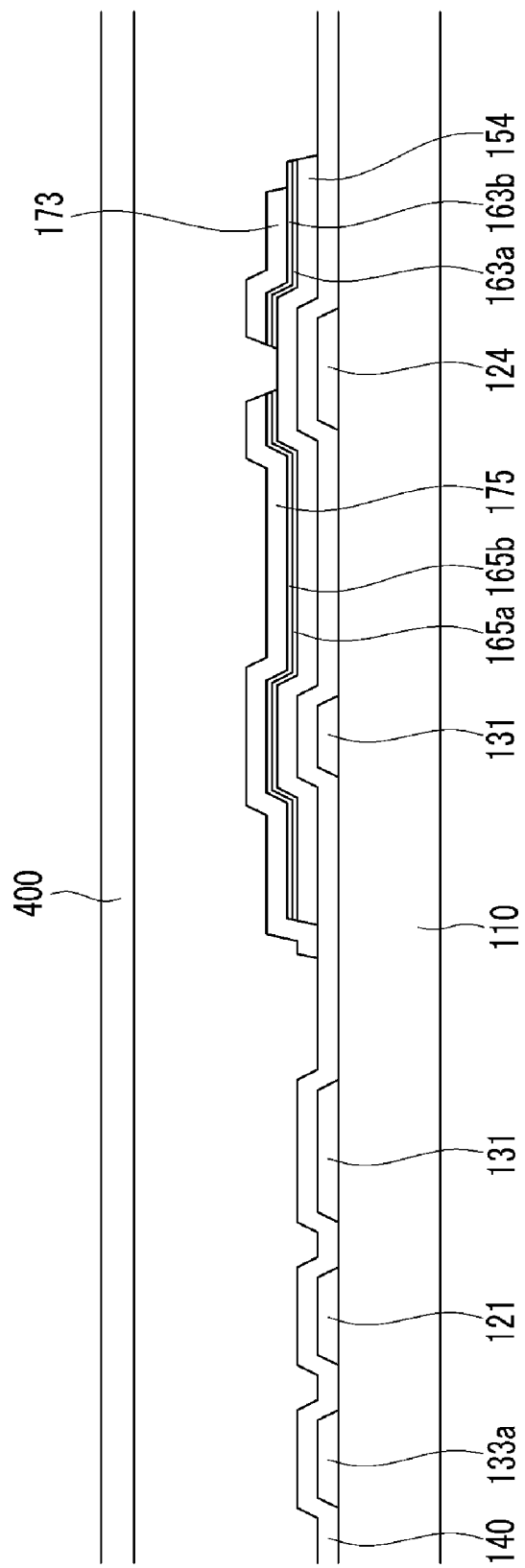
Figure 47B:
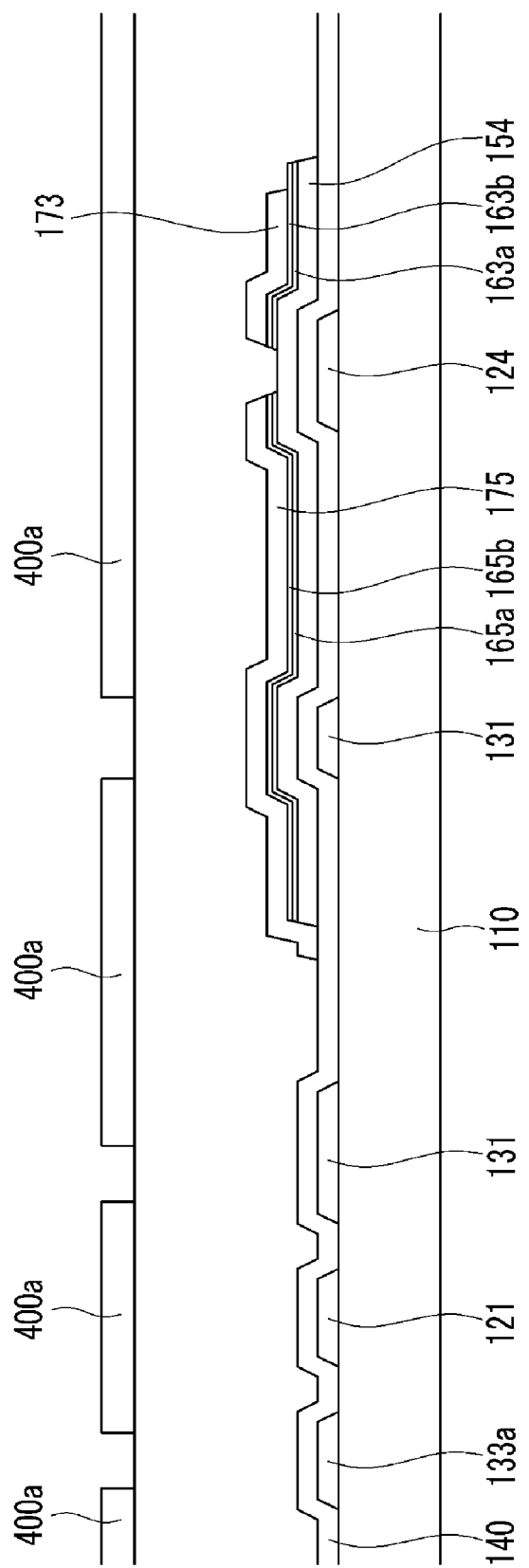

Referring to FIG. 47A, the passivation layer 180 is deposited and a photoresist film 400 is coated on the passivation layer 180. The photosensitive film 400 is subjected to light exposure and development to form a photosensitive layer pattern 400a as shown in FIG. 47B.

Figure 47C:
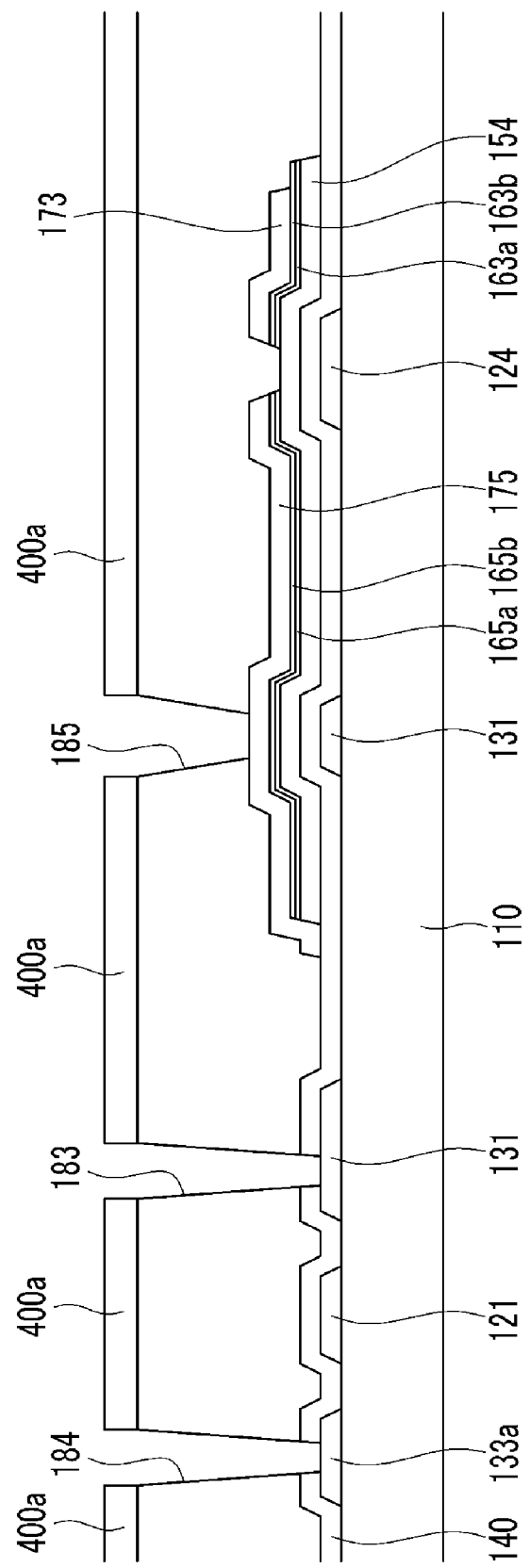

Referring to FIG. 47C, the passivation layer 180 and the gate insulating layer 140 are etched using the photosensitive layer pattern 400a as an etching mask to form the contact holes 181, 182, 183, 184, and 185.

Figure 47E:
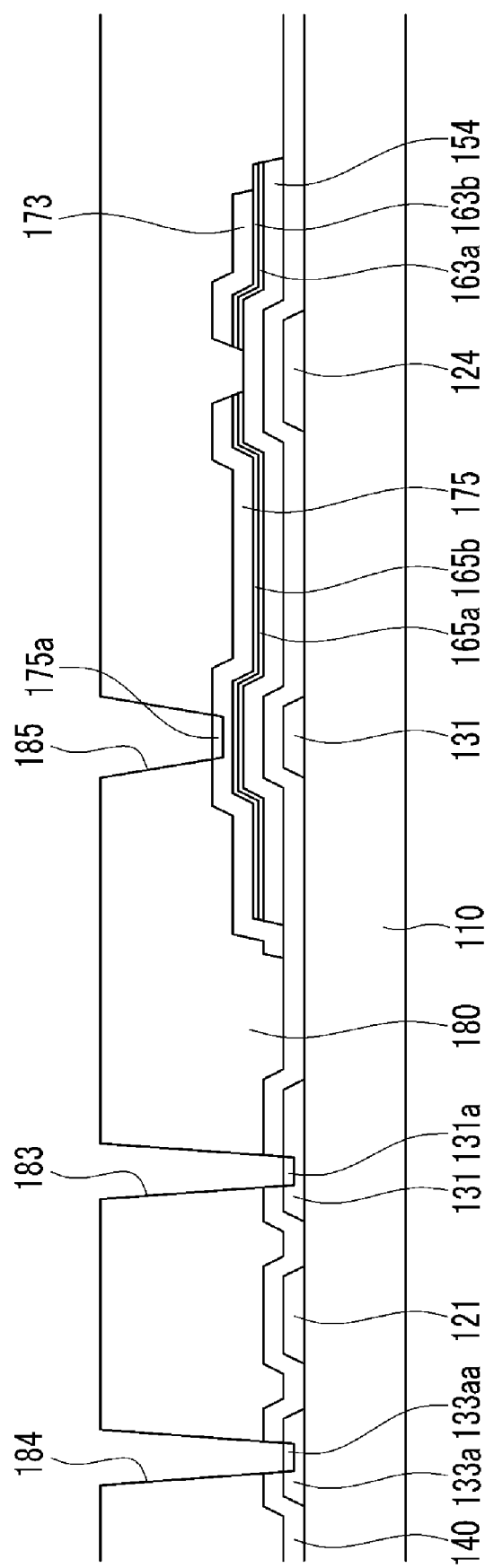

As shown in FIG. 47D, oxygen plasma treatment is performed on the photosensitive layer pattern 400a and the contact holes 181, 182, 183, 184, and 185 to implant oxygen to the exposed respective signal line through the contact holes 181, 182, 183, 184, and 185. Accordingly, the upper portions of each respective signal line exposed through the contact holes 181, 182, 183, 184, and 185 are transformed to an aluminum oxide layer to be the buffer members 129a, 179a, 131a, 133aa, and 175a. Here, the oxygen plasma treatment may be performed under a process pressure of about 100 mTorr or more. Then the photosensitive layer pattern 400a is removed as shown in FIG. 47E. Since the buffer members 129a, 179a, 131a, 133aa, and 175a are formed from part of the end portions 129, 179, storage electrode line 131, storage electrode 133a, and drain electrode 175, together with the contact holes 181, 182, 183, 184, and 185, the addition of the buffer members 129a, 179a, 131a, 133aa, and 175a does not require an additional lithography and etching step that would increase the production cost of the TFT array panel and complicate the manufacturing process.

Finally, as shown in FIG. 32 to FIG. 34, a transparent conducting layer of ITO or IZO is deposited on the passivation layer 180 by sputtering, etc., and is patterned to form a plurality of pixel electrodes 191, a plurality of contact assistants 81 and 82, and a plurality of overpasses 83.

As described above, the addition of the buffer members 129a, 179a, 131a, 133aa, and 175a does not require an additional lithography and etching step that would otherwise increase the production cost of the TFT array panel and complicate the manufacturing process because the buffer members 129a, 179a, 131a, 133aa, and 175a are formed together with the contact holes 181, 182, 183, 184, and 185, so that the contact characteristic between the pixel electrodes 191, the contact assistants 81 and 82, and the overpasses 83 including ITO or IZO and the portion of the gate lines 121, storage electrode lines 131, storage electrodes 133a, and the data lines 171 exposed through the contact holes 181, 182, 183, 184, and 185 may be improved to enhance the adhesion therebetween while not increasing the production cost of the TFT array panel.

Figure 48:
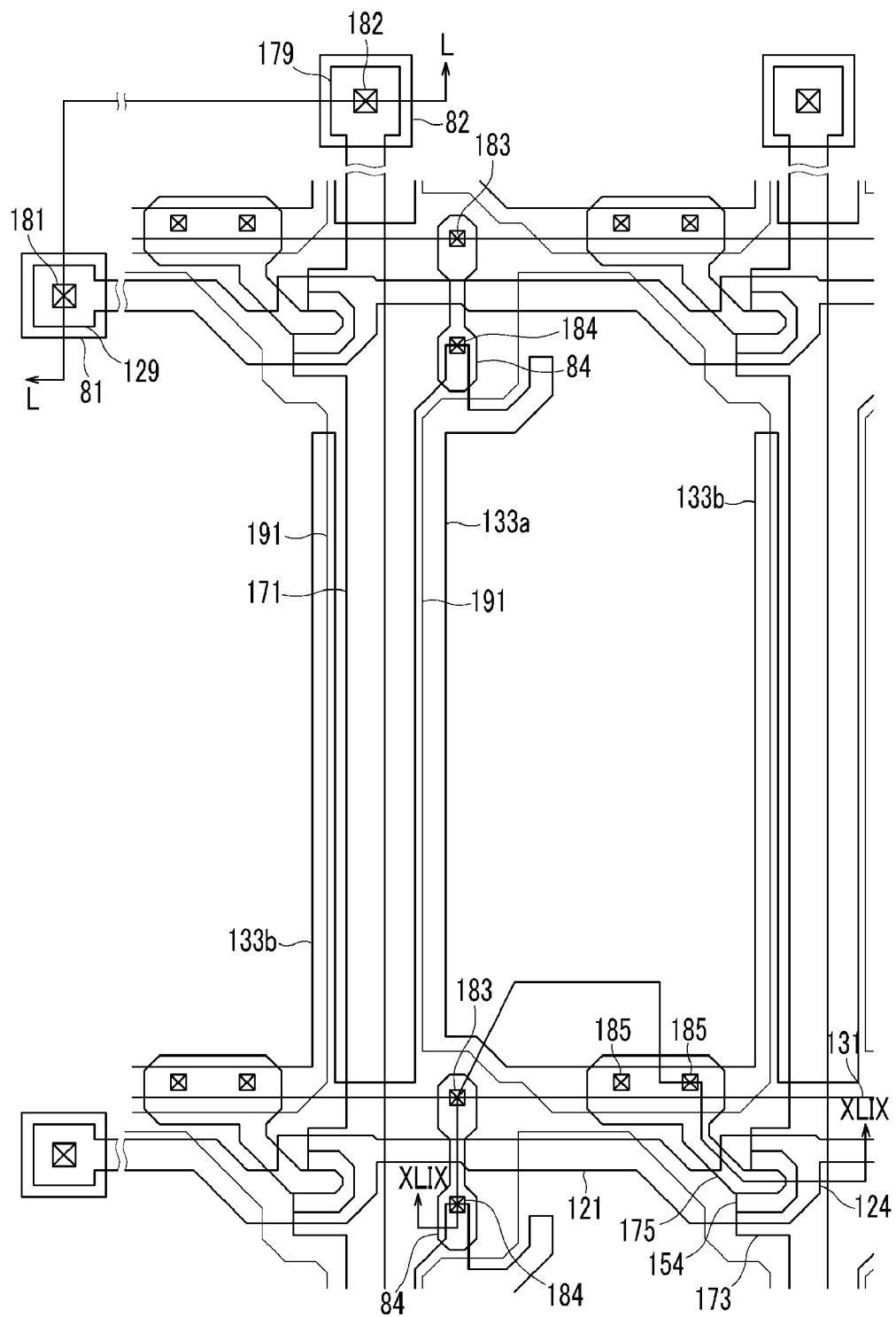
FIG. 48 is a layout view of an exemplary TFT array panel according to another exemplary embodiment of the present invention; and, FIG. 49 and FIG. 50 are cross-sectional views of the exemplary TFT array panel shown in FIG. 48 taken along lines XLIX-XLIX and L-L, respectively.

Now, an exemplary TFT array panel according to another exemplary embodiment of the present invention will be described in detail with reference to FIG. 48 to FIG. 50. FIG. 48 is a layout view of an exemplary TFT array panel according to another exemplary embodiment of the present invention, and FIG. 49 and FIG. 50 are cross-sectional views of the exemplary TFT array panel shown in FIG. 48 taken along lines XLIX-XLIX and L-L, respectively.

Figure 49:
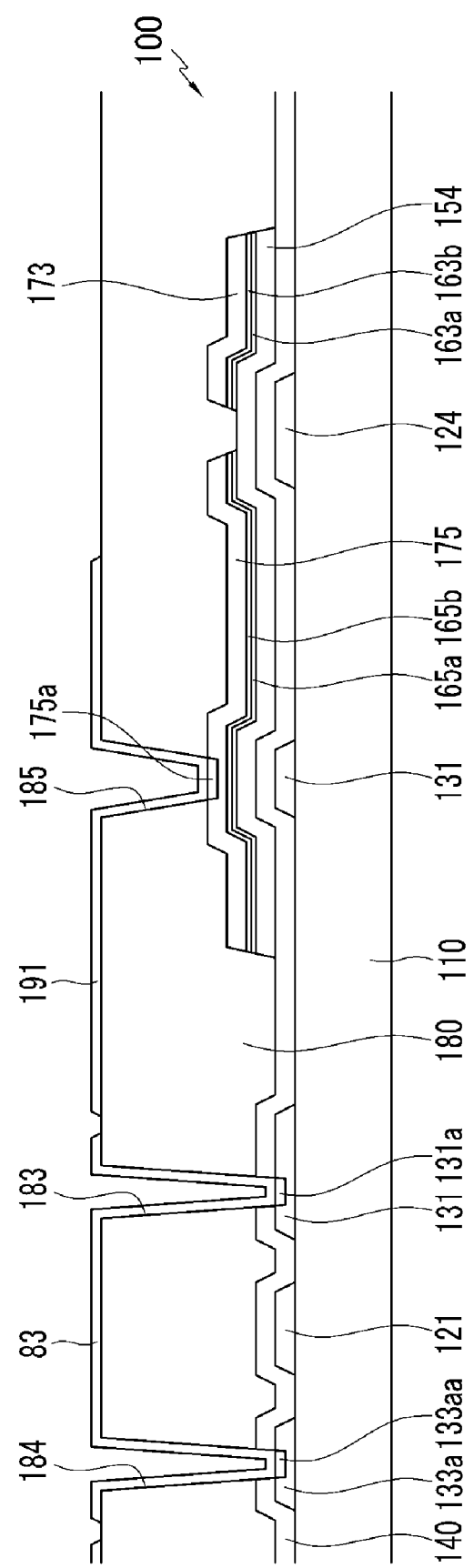
Figure 50:
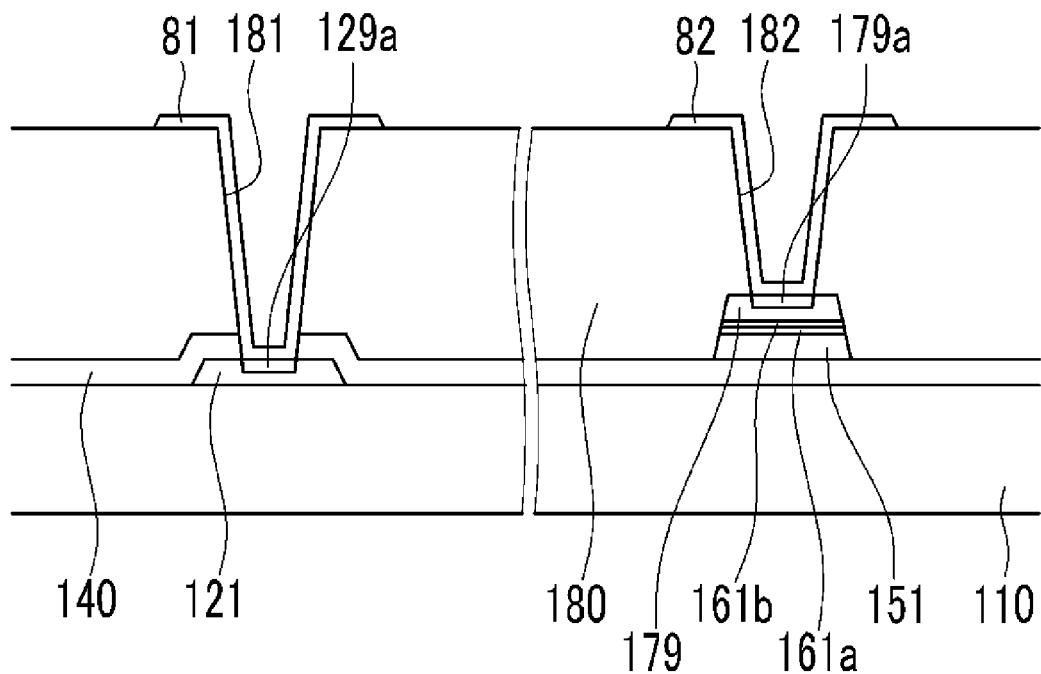

As shown in FIG. 48 to FIG. 50, a layered structure of an exemplary TFT array panel according to the present embodiment is substantially similar to that shown in FIG. 32 to FIG. 34.

A plurality of gate lines 121 including a plurality of gate electrodes 124 and a plurality of end portions 129, and a plurality of storage electrode lines 131 including a plurality of storage electrodes 133a and 133b, are disposed on a substrate 110. A gate insulating layer 140, a plurality of semiconductor stripes 151 including projections 154, a plurality of ohmic contact stripes 161a including projections 163a and a plurality of ohmic contact islands 165a, and a plurality of blocking layers 161b, 163b, and 165b are sequentially disposed on the gate lines 121 and the storage electrode lines 131.

A plurality of data lines 171 including source electrodes 173 and end portions 179 and a plurality of drain electrodes 175 are disposed on the blocking layers 161b, 163b, and 165b and the gate insulating layer 140, and a passivation layer 180 is disposed thereon.

The gate insulating layer 140 and the passivation layer 180 have a plurality of contact holes 181, 182, 183, 184, and 185, and a plurality of buffer members 129a, 179a, 131a, 133aa, and 175a disposed on the exposed respective signal lines through the contact holes 181, 182, 183, 184, and 185. A plurality of pixel electrodes 191, a plurality of contact assistants 81 and 82, and a plurality of overpasses 83 are disposed on the passivation layer 180 and the plurality of buffer members 129a, 179a, 131a, 133aa, and 175a.

However, unlike the exemplary TFT array panel shown in FIG. 32 to FIG. 34, the semiconductor stripes 151 have almost the same planar shapes as the data lines 171 and the drain electrodes 175 as well as the ohmic contacts 161 and 165. However, the projections 154 of the semiconductor stripes 151 include some exposed portions, which are not covered with the data lines 171 and the drain electrodes 175, such as portions located between the source electrodes 173 and the drain electrodes 175.

Like the TFT array panel according to the previous embodiment, the TFT array panel includes the blocking layers 161b, 163b, and 165b formed between the ohmic contacts 161a, 163a, and 165a and the data line 171 and drain electrode 175, and the buffer members 129a, 179a, 131a, 133aa, and 175a disposed on the exposed respective signal lines through the contact holes 181, 182, 183, 184, and 185. Accordingly, the diffusion of Al atoms of the data line 171 and the drain electrode 175 into the semiconductors 151 and 154 or ohmic contacts 161a and 165a may be blocked by the blocking layers 161b, 163b, and 165b, and the contact characteristic between the pixel electrodes 191, the contact assistants 81 and 82, and overpasses 83 including ITO or IZO and the exposed portions of the gate lines 121, storage electrode lines 131, storage electrodes 133a, and the data lines 171 and drain electrodes 175 through the contact holes 181, 182, 183, 184, and 185 may be improved to enhance the adhesion therebetween by the buffer members 129a, 179a, 131a, 133aa, and 175a.

Many characteristics of the exemplary TFT array panel shown in FIG. 32 to FIG. 34 can be applied to the exemplary TFT array panel shown in FIG. 48 to FIG. 50.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
    a substrate;
    a gate line disposed on the substrate, including a gate electrode, and having a single-layered structure, and a storage line disposed on the substrate and having a single-layered structure;
    a gate insulating layer disposed on the gate line;
    a semiconductor layer disposed on the gate insulating layer;
    a data line disposed on the semiconductor layer, including a source electrode, and having a single-layered structure;
    a drain electrode disposed on the semiconductor layer, spaced apart from the source electrode, and having a single-layered structure;
    a passivation layer disposed on the data line and the drain electrode, and having a first contact hole exposing the drain electrode;
    a first buffer member in an upper surface of the drain electrode exposed through the first contact hole; and
    a pixel electrode electrically connected to the drain electrode through the first buffer member.

2. The thin film transistor array panel of claim 1, wherein the gate line and the data line comprise a same material.

3. The thin film transistor array panel of claim 2, wherein the gate line and the data line comprise aluminum or an aluminum alloy.

4. The thin film transistor array panel of claim 3, wherein the first buffer member comprises an aluminum oxide layer.

5. The thin film transistor array panel of claim 1, wherein the first buffer member comprises a metal oxide layer.

6. The thin film transistor array panel of claim 3, wherein the first buffer member comprises an aluminum oxide layer.

7. The thin film transistor array panel of claim 1, further comprising
    a blocking layer disposed between the semiconductor layer and the data line and drain electrode, and comprising nitrogen or a nitrogen compound.

8. The thin film transistor array panel of claim 1, wherein the passivation layer and the gate insulating layer have a second contact hole exposing a portion of the storage line and the passivation layer has a third contact hole exposing a portion of the data line,
    further comprising:
    a second buffer member disposed in an upper surface of the storage line exposed through the second contact hole; and
    a third buffer member disposed in an upper surface of the data line exposed through the third contact hole.

9. The thin film transistor array panel of claim 8, wherein the storage line and the data line comprise a same material.

10. The thin film transistor array panel of claim 9, wherein the storage line and the data line comprise aluminum or an aluminum alloy.

11. The thin film transistor array panel of claim 10, wherein the first buffer member, the second buffer member, and the third buffer member comprise an aluminum oxide layer.

12. The thin film transistor array panel of claim 8, wherein the first buffer member, the second buffer member, and the third buffer member comprise an aluminum oxide layer.

13. The thin film transistor array panel of claim 8, further comprising
    a blocking layer disposed between the semiconductor layer and the data line and drain electrode, and comprising nitrogen or a nitrogen compound.

* * * * *